United States Patent
Maruyama et al.

(10) Patent No.: US 6,807,108 B2
(45) Date of Patent: Oct. 19, 2004

(54) SEMICONDUCTOR MEMORY DEVICE HAVING SELECT CIRCUIT

(75) Inventors: Yukiko Maruyama, Hyogo (JP); Takashi Itou, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/266,692

(22) Filed: Oct. 9, 2002

(65) Prior Publication Data
US 2003/0189854 A1 Oct. 9, 2003

(30) Foreign Application Priority Data
Apr. 5, 2002 (JP) ........................................ 2002-103970

(51) Int. Cl.⁷ ............................................. G11C 11/34
(52) U.S. Cl. ................................. 365/189.05; 365/190
(58) Field of Search ............................. 365/189.05, 190

(56) References Cited

U.S. PATENT DOCUMENTS 6,037,813 A * 3/2000 Eto et al. ..................... 327/156
6,242,960 B1 * 6/2001 Bae ............................. 327/299
6,339,555 B1 * 1/2002 Hamada et al. .............. 365/201
6,343,035 B1   1/2002 Kubo et al. ............. 365/189.05

FOREIGN PATENT DOCUMENTS

| JP | 3-171849 | 7/1991 |
| JP | 2001-143471 | 5/2001 |

* cited by examiner

Primary Examiner—M. Tran
(74) Attorney, Agent, or Firm—McDermott Will & Emery LLP

(57) ABSTRACT

An input buffer circuit includes a first input buffer and a second input buffer. The first input buffer receives an external data signal and a reference potential to output an internal data signal. The second input buffer receives external data signals complementary to each other to output the internal data signal. The input buffer circuit causes either the first or second input buffer to operate in response to a control signal outputted from a control circuit. Due to this, this semiconductor memory device can correspond to various types of data processing systems.

9 Claims, 25 Drawing Sheets

SEMICONDUCTOR MEMORY DEVICE
HAVING SELECT CIRCUIT

BACKGROUND OF THE INVENTION

1. Field of the Invention

The present invention relates to a semiconductor memory device and particularly relates to a semiconductor memory device which receives data from an external data bus.

2. Description of the Background Art

FIG. 29 is a block diagram showing the configuration of a data processing system which employs a plurality of semiconductor memory devices.

Referring to FIG. 29, a data processing system 200 includes a controller 201, a PLL circuit 202 and a plurality of semiconductor memory devices 203.

Controller 201 controls overall processing system 200. Controller 201 outputs an address signal ADD for designating each semiconductor memory device 203 and a data signal DQ for transmitting data to each semiconductor memory device 203, to a plurality of semiconductor memory devices 203. In addition, controller 201 outputs a clock signal CLK to PLL circuit 202.

PLL circuit 202 consists of a buffer circuit. PLL circuit 202 receives the signal outputted from controller 201 and outputs a clock signal EXTCLK for controlling respective semiconductor memory devices 203. It is noted that a clock signal bus 204 is grounded for each semiconductor memory device 203.

Each semiconductor memory device 203 converts data signal DQ transmitted from controller 201 into an internal data signal DIN by an input buffer grounded in each memory 203.

FIG. 30 is a circuit diagram showing the configuration of the input buffer grounded in each memory 203 shown in FIG. 29.

Referring to FIG. 30, input buffer 100 includes P-channel MOS transistors 1 to 4 and N-channel MOS transistors 5 to 8.

P-channel MOS transistors 1 and 2, and N-channel MOS transistors 5, 6 and 8 constitute a comparator. P-channel MOS transistors 1 and 2 constitute a current mirror circuit and the sources thereof are connected to an internal power supply potential node 9.

The source of N-channel MOS transistor 8 is connected to a ground potential node 10 and a control signal EN generated inside semiconductor memory device 203 is inputted into the gate of N-channel MOS transistor 8. Control signal EN is a signal the level of which becomes H level when input buffer 100 operates.

An external data signal EXTDQ transmitted from controller 201 is inputted into the gate of N-channel MOS transistor 5. In addition, a reference potential VREF is inputted into the gate of N-channel MOS transistor 6. Reference potential VREF is generated inside of semiconductor memory device 203. The sources of both N-channel MOS transistors 5 and 6 are connected to the drain of N-channel MOS transistor 8.

Each of MOS transistors 1, 2, 5, 6 and 8 compares the level of external data signal EXTDQ with that of reference potential VREF and outputs a signal VO at potential level according to the comparison result.

P-channel MOS transistor 4 and N-channel MOS transistor 7 constitute an inverter 11. Inverter 11 receives and inverts signal VO and outputs the inverted signal as internal data signal DIN.

The source of P-channel MOS transistor 3 is connected to the sources of P-channel MOS transistors 2 and 4 and the drain thereof is connected to the drain of P-channel MOS transistor 2 and the gate of P-channel MOS transistor 4. Control signal EN is inputted into the gate of P-channel MOS transistor 3. As a result, when control signal EN is at H level, input buffer 100 stops operating.

Acceleration and low power consumption have been recently demanded for the data processing system which employs the semiconductor memory devices respectively including the input buffers constituted as described above. To meet the demand, therefore, the data processing system has been accelerated year by year. However, following the acceleration, noise which is generated on a transmission path has become disadvantageous to the data processing system.

In the data processing system, various external factors are applied to thereby increase power supply noise on a substrate. In addition, the data processing system has a disadvantage in that DQ coupling noise is generated depending on the wiring layout of transmission paths which connect the controller to the semiconductor memory devices in the data processing system. In designing the transmission paths of the data processing system, therefore, it is necessary to consider the improvement of noise resistance.

A circuit configuration which enables the improvement of the noise resistance is reported in Japanese Patent Laying-Open No. 3-171849.

FIG. 31 is a circuit diagram showing the configuration of an input buffer which enables the improvement of noise resistance.

Referring to FIG. 31, input buffer 101, similar to input buffer 100, includes P-channel MOS transistors 1 to 4 and N-channel MOS transistors 5 to 8.

An external data signal ZEXTDQ instead of reference potential VREF is inputted into the gate of N-channel MOS transistor 6 of input buffer 101, compared with input buffer 100. External data signal ZEXTDQ is a complementary signal to external data signal EXTDQ. Since the remaining circuit configuration is the same as that of input buffer 100, it will not be repeatedly described herein.

Semiconductor memory device 203 including input buffer 101 shown in FIG. 31 receives complementary external data signals EXTDQ and ZEXTDQ from controller 201. Therefore, controller 201 is connected to respective semiconductor memory devices 203 by complementary data buses.

According to the above-mentioned configuration, each semiconductor memory device 203 is connected to the complementary data buses and complementary external data EXTDQ and ZEXTDQ are transmitted on the complementary data buses. As a result, coupling noise generated on the data buses turns into a common mode. Therefore, the common mode noise transmitted by the complementary data buses can be offset each other by the amplification operation of the comparator in input buffer 101.

As described above, if the input buffer is constituted to input complementary external data signals into the input buffer, it is possible to decrease the amplitude of each signal transmitted on the data bus. In addition, compared with input buffer 100 which receives reference potential VREF, input buffer 101 has improved through rate dependency and VCC dependency.

Consequently, by constituting the complementary data buses, it is possible to decrease the power consumption of the data processing system.

As described above, if the data processing system has, as the transmission paths, the complementary data buses which transmit complementary signals, the noise resistance of the system is improved, whereby the data processing system can operate stably.

However, if wirings as many as those used in double data buses transmitting complementary signals are used in a single data bus, data twice as many can be transferred to the complementary buses. Therefore, despite a disadvantage in the stability of the operation more or less, the usage range of such a data processing system is sufficiently wide.

Further, since various types of data processing systems are present, it is more preferable that the degree of freedom for transmission path design is increased so as to be able to correspond to various types of systems.

SUMMARY OF THE INVENTION

It is an object of the present invention to provide a semiconductor memory device capable of corresponding to various types of data processing systems.

A semiconductor memory device according to the present invention includes an input buffer and a select circuit. The input buffer receives a first data signal inputted from an outside of the semiconductor memory device, a second data signal complementary to the first data signal and inputted from the outside, and a reference signal, and generates an internal data signal. The select circuit selects a signal used when the input buffer generates the internal data signal, from the second data signal and the reference signal.

It is thereby possible to select the use of a single data bus and complementary data buses to correspond to various data processing systems.

A semiconductor memory device according to the present invention includes a first input buffer, a second input buffer, and an internal circuit. The first input buffer receives a first data signal inputted from an outside of the semiconductor memory device, and a reference signal, and generates a first internal data signal. The second input buffer receives a second data signal inputted from the outside and complementary to the first data signal, and the reference signal, and generates a second internal data signal. The internal circuit receives a strobe signal inputted from the outside for fetching the first and second data signals, and receives the first and second internal data signals.

It is thereby possible to dispense with a serial/parallel conversion circuit which has been required in a conventional semiconductor memory device.

The semiconductor memory device according to the present invention can select which to use, the single data bus or the double data buses when an external data signal or external data signals are inputted and outputted. As a result, the semiconductor memory device according to the present invention can correspond to various types of data processing systems.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter in detail with reference to the drawings. It is noted that the same or corresponding sections are denoted by the same reference symbols, respectively throughout the drawings and they will not be repeatedly described.

First Embodiment

Figure 1:
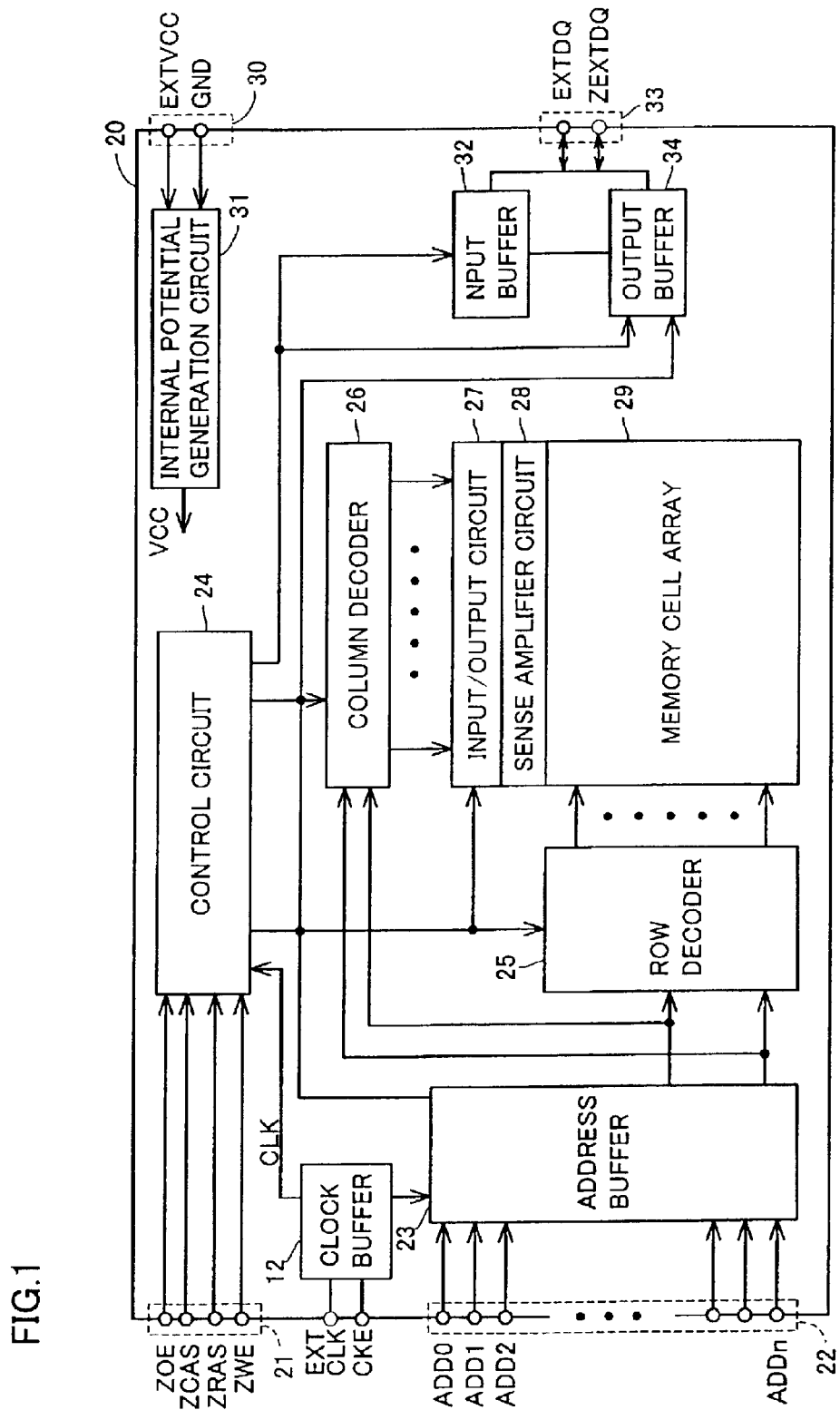
FIG. 1 is a schematic block diagram showing the overall configuration of a semiconductor memory device in the first embodiment of the present invention.

FIG. 1 is a schematic block diagram showing the overall configuration of a semiconductor memory device in the embodiment of the present invention.

Referring to FIG. 1, a semiconductor memory device 20 includes a plurality of control signal input terminals 21 which receive control signals such as a column address strobe signal ZCAS, a row address strobe signal ZRAS, a write enable signal ZWE and an output enable signal ZOE, respectively, a plurality of address input terminals 22 which receive address signals ADD0 to ADDn (where n is a natural number), respectively, and a plurality of data input/output terminals 33 which transmit and receive a plurality of external data signals EXTDQ and ZEXTDQ, respectively.

Semiconductor memory device 20 also includes a clock buffer 12, a control circuit 24, a memory cell array 29, an address buffer 23, a row decoder 25, a column decoder 26, a sense amplifier circuit 28, an input/output circuit 27, an input buffer 32 and an output buffer 34.

Clock buffer 12 receives external clock signal EXTCLK and a clock enable signal CKE, and outputs clock signal CLK. Control circuit 24 controls the overall operation of semiconductor memory device 20 in response to the control signals inputted into respective input terminals 21.

Memory cell array 29 includes a plurality of memory cells arranged in a matrix. A word line is arranged for each row of the memory cells and a bit line is arranged for each column of the memory cells. Each memory cell is arranged to correspond to the intersection between the word line and the bit line.

Address buffer 23 selectively supplies address signals ADD0 to ADDn inputted from the outside to row decoder 25 and column decoder 26. Row decoder 25 selects one of a plurality of word lines in response to a row address signal supplied from address buffer 23. Column decoder 26 drives at least one of a plurality of bit lines in response to a column address signal supplied from address buffer 23. Sense amplifier circuit 28 includes a plurality of sense amplifiers.

Input/output circuit 27 supplies the potential level of the bit line selected by column decoder 26 to output buffer 34. Output buffer 34 amplifies the potential level supplied and outputs the amplified potential level to the outside of memory 20 through a plurality of data input/output terminals 33. Input buffer 32 receives a plurality of external data signals EXTDQ and ZEXTDQ and outputs internal data signal DIN.

Semiconductor memory device 20 further includes an internal potential generation circuit 31. Internal potential generation circuit 31 receives an external power supply potential EXTVCC and a ground potential GND from the outside, and outputs an internal power supply potential VCC.

Figure 2:
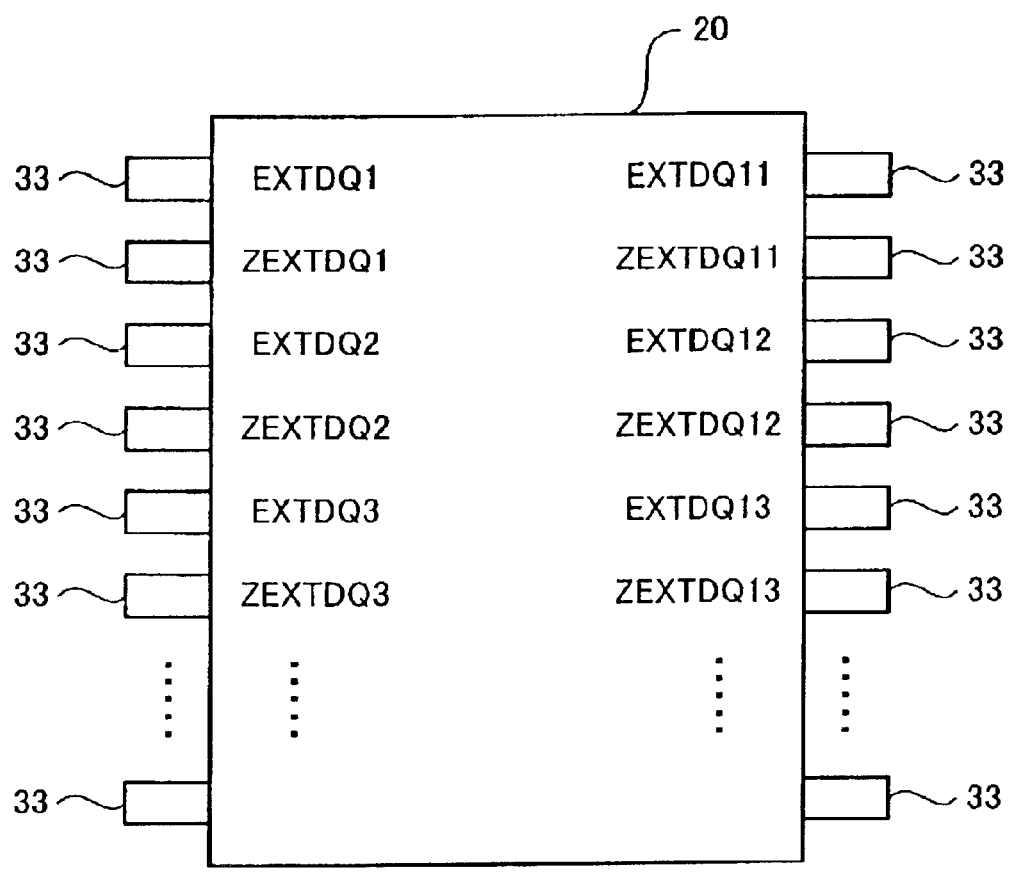
FIG. 2 is a view which shows the layout of pins in the semiconductor memory device shown in FIG. 1.

FIG. 2 is a view which shows the layout of the pins of semiconductor memory device 20.

Referring to FIG. 2, a plurality of pins 33 of semiconductor memory device 20 are the same as a plurality of data input/output terminals 33 shown in FIG. 1. For a plurality of pieces of data, pins 33 which input/output external data signal EXTDQ and pins 33 which input/output external data signal ZEXTDQ complementary to EXTDQ are alternately arranged.

Figure 3:
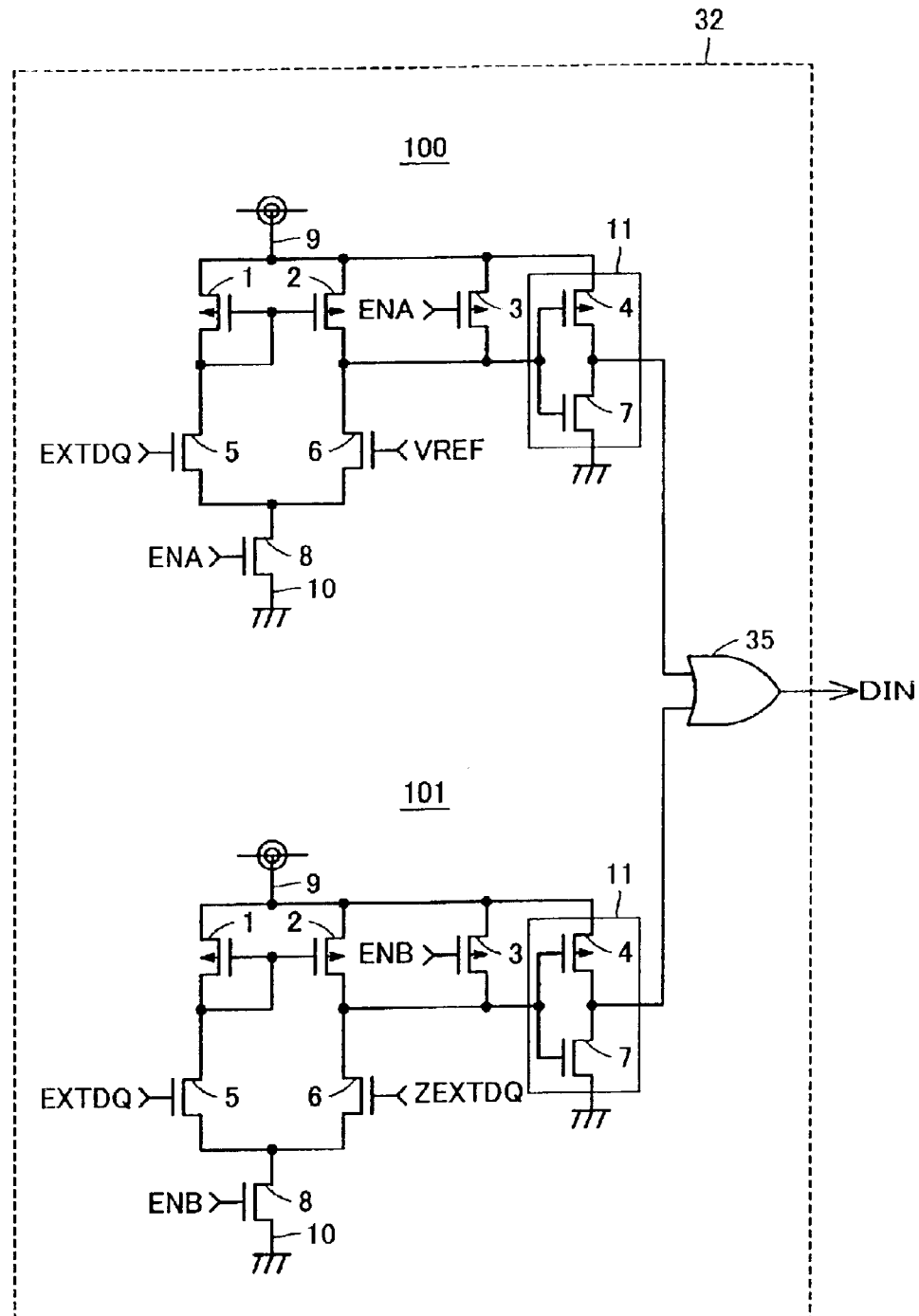
FIG. 3 is a circuit diagram showing the detailed configuration of an input buffer shown in FIG. 1.

FIG. 3 is a circuit diagram showing the detailed configuration of input buffer 32 shown in FIG. 1.

Referring to FIG. 3, input buffer 32 includes input buffers 100 and 101 and a logic gate 35.

Figure 30:
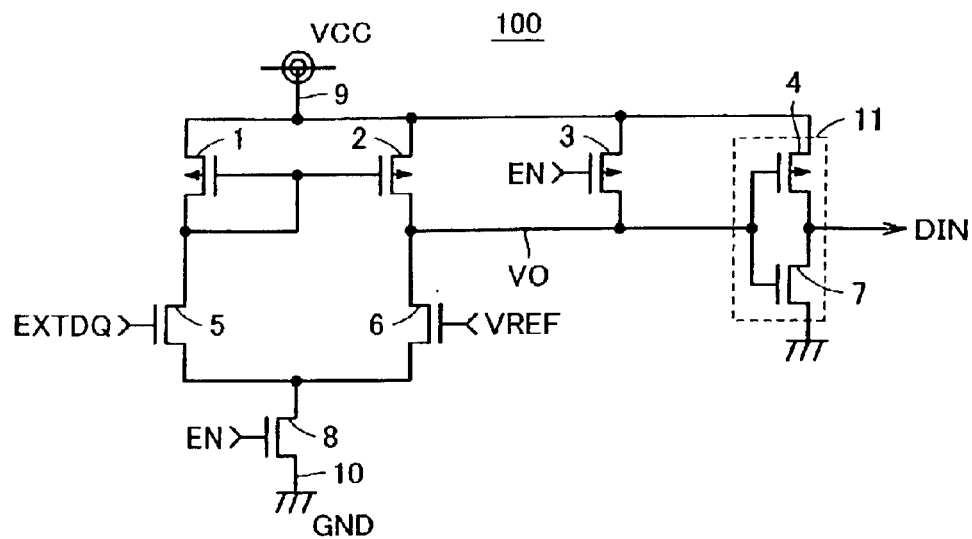
FIG. 30 is a circuit diagram showing the configuration of an input buffer grounded in each semiconductor memory device shown in FIG. 29.

Input buffer 100 includes P-channel MOS transistors 1 to 4 and N-channel MOS transistors 5 to 8. In input buffer 100, a control signal ENA is inputted into the gate of P-channel MOS transistor 3 and N-channel MOS transistor 8. Here, control signal ENA is a signal which is outputted from control circuit 24. When operating input buffer 100, control signal ENA is set at H level. When stopping the operation of input buffer 100, control signal ENA is set at L level. Since the remaining circuit configuration is the same as that shown in FIG. 30, it will not be repeatedly described herein.

Figure 31:
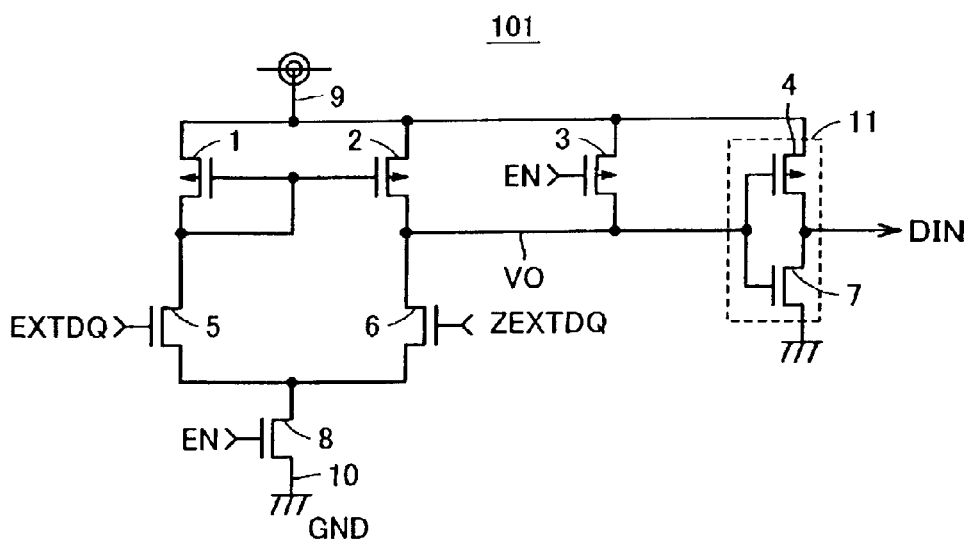
FIG. 31 is a circuit diagram showing the configuration of an input buffer capable of improving noise resistance.

Input buffer 101 includes P-channel MOS transistors 1 to 4 and N-channel MOS transistors 5 to 8. A control signal ENB is inputted into the gates of P-channel MOS transistor 3 and N-channel MOS transistor 8 of input buffer 101. Here, when operating input buffer 101, control signal ENB is set at H level. When stopping the operation of input buffer 101, control signal ENB is set at L level. Since the remaining circuit configuration is the same as that shown in FIG. 31, it will not be repeatedly described herein.

Logic gate 35 receives the output signal of input buffer 100 and that of input buffer 101, and outputs an OR logic operation result as internal data signal DIN.

Figure 4:
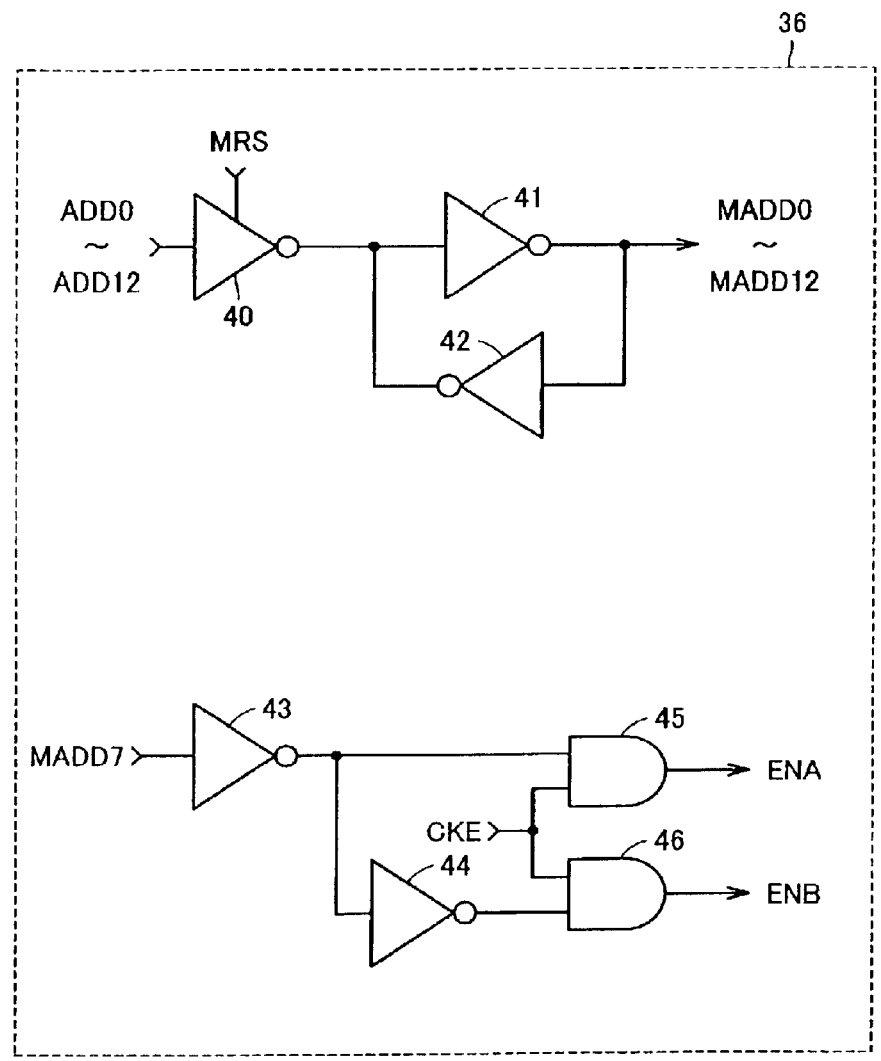
FIG. 4 is a circuit diagram showing the configuration of a select circuit which outputs a control signal for operating the input buffer.

FIG. 4 is a circuit diagram showing the configuration of a select circuit which outputs a control signal for operating the input buffer. It is noted that the select circuit is included in control circuit 24.

Referring to FIG. 4, a write select circuit 36 includes a clocked inverter 40, inverters 41 to 44 and logic gates 45 and 46. Clocked inverter 40 receives a mode register set (MRS) command and starts operating. The mode register set (MRS) command is a command issued from control circuit 24.

Clocked inverter 40 receives and inverts address signals ADD0 to ADD12, and outputs the inverted signals. Inverters 41 and 42 constitute a latch circuit. Inverter 41 receives and inverts the output signals of docked inverter 40, and outputs the inverted signals as signals MADD0 to MADD12, respectively. Inverter 43 receives and inverts signal MADD7 among signals MADD0 to MADD12 outputted from inverter 41, and outputs the inverted signal.

Inverter 44 receives and inverts the output signal of inverter 43 and outputs the inverted signal. Logic gate 45 receives the output signal of inverter 43 and clock enable signal CKE, and outputs an AND logic operation result as signal control signal ENA. Logic gate 46 receives the output signal of inverter 44 and clock enable signal CKE, and outputs an AND logic operation result as control signal ENB.

The operation of input buffer 32 having the above-mentioned circuit configuration will be described. Write select circuit 36 in control circuit 24 receives address signal ADD7 when the mode register set command is issued. Therefore, signal MADD7 is inputted into inverter 43. As a result, logic gate 46 outputs H-level control signal ENB in response to clock enable signal CKE. Logic gate 45 receives the L-level signal from inverter 43 and, therefore, outputs L-level control signal ENA.

As a result, in input buffer 32, input buffer 101 which receives H-level control signal ENB starts operating and input buffer 100 which receives L-level control signal ENA stops operating. Consequently, input buffer 32 receives complementary internal data signals EXTDQ and ZEXTDQ, and outputs internal data signal DIN. At this moment, therefore, semiconductor memory device 20 uses complementary data buses.

On the other hand, if address signal ADD7 is at L level when the mode register set command is issued, write select circuit 36 outputs H-level control signal ENA, and outputs L-level control signal ENB. As a result, in input buffer 32, input buffer 101 stops operating and input buffer 100 starts operating. In this case, therefore, input buffer 32 receives external data signal EXTDQ and reference potential VREF transmitted from a single bus and outputs internal data signal DIN. At this moment, therefore, semiconductor memory device 20 uses the single data bus.

As can be seen, by selecting either control signal ENA or ENB by write select circuit 36 in control circuit 24, it is possible to determine whether the input buffer operates using the single bus or the complementary data buses. It is thus possible to correspond to various types of data processing systems.

Figure 5:
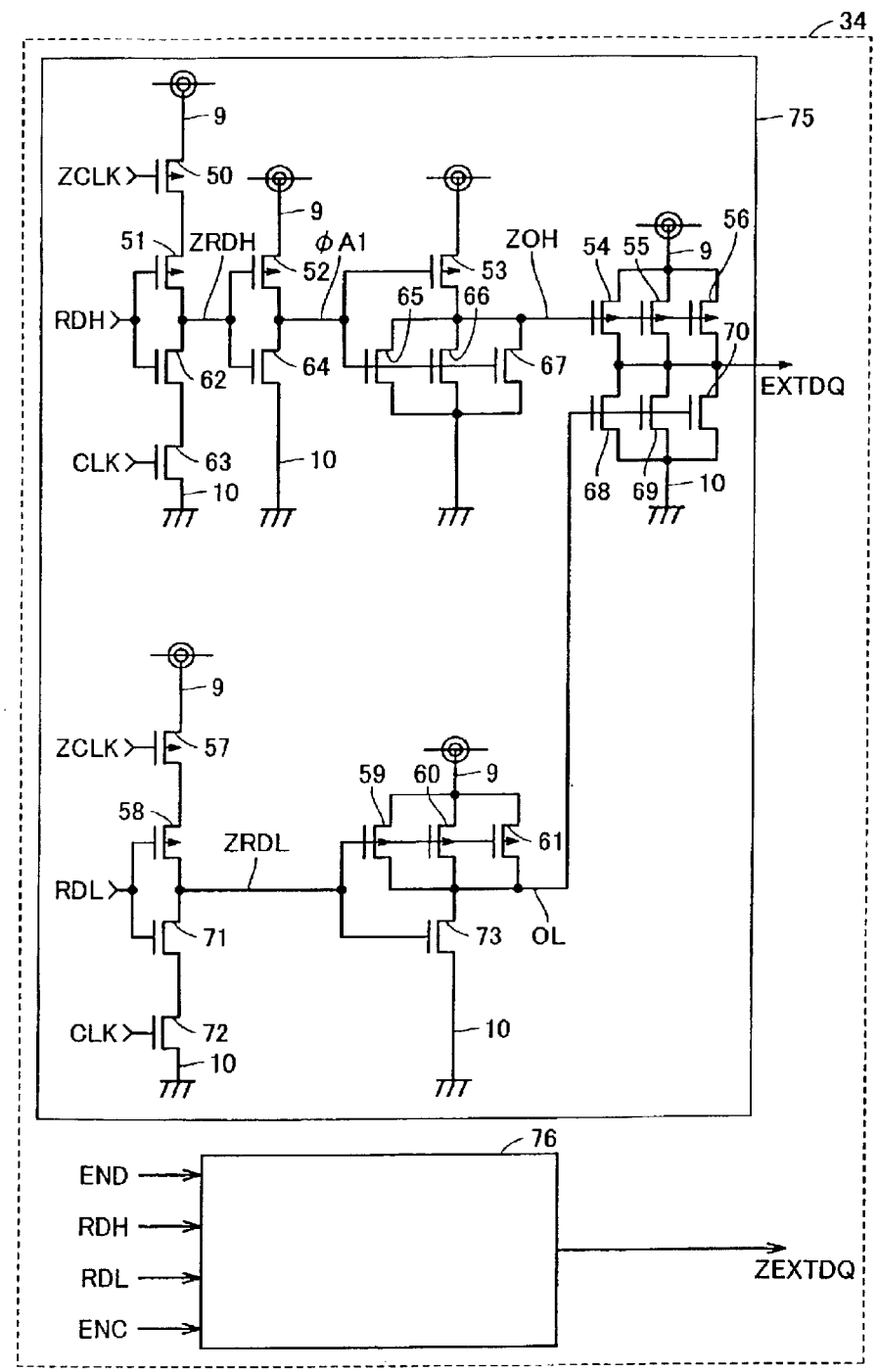
FIG. 5 is a circuit diagram showing the detailed configuration of an output buffer shown in FIG. 1.

FIG. 5 is a circuit diagram showing the detailed configuration of output buffer 34 shown in FIG. 1.

Referring to FIG. 5, output buffer 34 includes a first output buffer 75 and a second output buffer 76.

First output buffer 75 includes P-channel MOS transistors 50 to 61 and N-channel MOS transistors 62 to 73.

P-channel MOS transistors 50 and 51 and N-channel MOS transistors 62 and 63 are connected in series between internal power supply potential node 9 and ground potential node 10. A clock signal ZCLK is inputted into the gate of N-channel MOS transistor 50 and clock signal CLK is inputted into the gate of N-channel MOS transistor 63. A read data signal RDH read from a memory cell in memory cell array 29 during a read operation is inputted into the gate of P-channel MOS transistor 51 and that of N-channel MOS transistor 62. Read data signal RDH is a data signal which is read at the rise of external clock signal EXTCLK.

A signal ZRDH is outputted from the connection point between P-channel MOS transistor 51 and N-channel MOS transistor 62. P-channel MOS transistor 52 and N-channel MOS transistor 64 are connected in series between internal power supply potential node 9 and ground potential node 10. The gates of both P-channel MOS transistor 52 and N-channel MOS transistor 64 receive signal ZRDH. A signal φA is outputted from the connection point between MOS transistors 52 and 64.

P-channel MOS transistor 53 and N-channel MOS transistor 66 are connected in series between internal power supply potential node 9 and ground potential node 10. N-channel MOS transistors 65 and 67 are connected in parallel to N-channel MOS transistor 66. The gates of P-channel MOS transistor 53 and N-channel MOS transistors 65 to 67 all receive signal φA1. A signal ZOH is outputted from the connection point between P-channel MOS transistor 53 and N-channel MOS transistor 66.

P-channel MOS transistors 57 and 58 and N-channel MOS transistors 71 and 72 are connected in series between internal power supply potential node 9 and ground potential node 10. Clock signal ZCLK is inputted into the gate of P-channel MOS transistor 57 and clock signal CLK is inputted into the gate of N-channel MOS transistor 72. In addition, a read data signal RDL is inputted into the gates of both of P-channel MOS transistor 58 and N-channel MOS transistor 71. Read data signal RDL is a data signal which is read at the fall of external clock signal EXTCLK. A signal ZRDL is outputted from the connection point between MOS transistors 58 and 71.

P-channel MOS transistor 60 and N-channel MOS transistor 73 are connected in series between internal power supply potential node 9 and ground potential node 10. P-channel MOS transistors 59 and 61 are connected in parallel to P-channel MOS transistor 60. Signal ZRDL is inputted into the gates of MOS transistors 59 to 61 and 73. A signal OL is outputted from the connection point between transistors 60 and 73.

P-channel MOS transistor 54 and N-channel MOS transistor 68 are connected in series between internal power supply potential node 9 and ground potential node 10. Likewise, P-channel MOS transistor 55 and N-channel MOS transistor 69 are connected in series, and P-channel MOS transistor 56 and N-channel MOS transistor 70 are connected in series. A signal ZOH is inputted into the gates of P-channel MOS transistors 54 to 56, and a signal OL is inputted into the gates of N-channel MOS transistors 68 to 70. External data signal EXTDQ is outputted from the connection point between transistors 56 and 70.

Since the circuit configuration of second output buffer 76 is the same as that of first output buffer 75, it will not be repeatedly described herein. It is noted that a control signal END instead of clock signal ZCLK is inputted into the gates of P-channel MOS transistors 50 and 57 in second output buffer 76. In addition, a control signal ENC instead of clock signal CLK is inputted into the gates of N-channel MOS transistors 63 and 72. Second output buffer 76 outputs external data signal ZEXTDQ.

Figure 6:
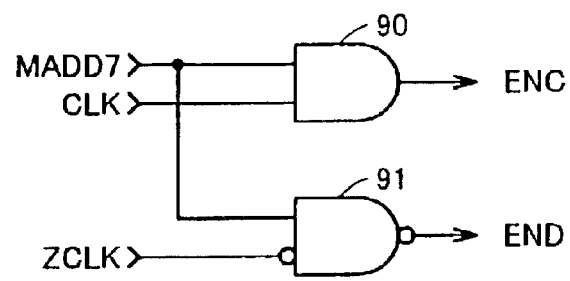
FIG. 6 is a circuit diagram showing the configuration of a read select circuit.

FIG. 6 is a circuit diagram showing the configuration of a read select circuit.

Read select circuit is included in control circuit 24 shown in FIG. 1.

Referring to FIG. 6, a read select circuit 77 includes logic gates 90 and 91.

Logic gate 90 receives signal MADD7 generated by write select circuit 36 and clock signal CLK, and outputs an AND logic operation result as control signal ENC. Logic gate 91 receives signal MADD7 and the inverted signal of clock signal ZCLK, and outputs a NAND logic operation result as control signal END.

The operation of output buffer 34 having the above-mentioned circuit configuration will be described.

First, the operation of output buffer 34 if address signal ADD7 is at H level when the mode register set command is issued will be described.

If address signal ADD7 is at H level when the mode register set command is issued, signal MADD7 is set at H level by write select circuit 36.

Therefore, when clock signal CLK is at H level, logic gate 90 outputs H-level control signal ENC and logic gate 91 outputs L-level control signal END. When clock signal CLK is at L level, logic gate 90 outputs L-level control signal ENC and logic gate 91 outputs H-level control signal END.

Therefore, when clock signal CLK is at H level, P-channel MOS transistors 50 and 57 are turned on and N-channel MOS transistors 63 and 72 are also turned on in first output buffer 75. Consequently, when clock signal CLK is at H level, first output buffer 75 operates and outputs external data signal EXTDQ.

On the other hand, when clock signal CLK is at H level, control signal ENC is at H level and control signal END is at L level. Therefore, P-channel MOS transistors 50 and 57 are turned on and N-channel MOS transistors 63 and 72 are also turned on in second output buffer 76. Therefore, when clock signal CLK is at H level, second output buffer 76 also operates and outputs external data signal ZEXTDQ.

As a result of the above, if address signal ADD7 is at H level when the mode register set command is issued, output buffer 34 outputs complementary external data signals EXTDQ and ZEXTDQ. At this time, therefore, semiconductor memory device 20 corresponds to the complementary data buses.

The operation of output buffer 34 if address signal ADD7 is at L level when the mode register set command is issued will next be described.

If address signal ADD7 is at L level when the mode register set command is issued, signal MADD7 is set at L level by write select circuit 36.

Therefore, irrespectively of clock signal CLK, logic gate 90 outputs L-level control signal ENC and logic gate 91 outputs H-level control signal END.

Consequently, when clock signal CLK is at H level, first output buffer 75 operates and outputs external data signal EXTDQ.

However, when clock signal CLK is at H level, control signal ENC is at L level and control signal END is at H level. Therefore, P-channel MOS transistors 50 and 57 are turned off and N-channel MOS transistors 63 and 72 are also turned off in second output buffer 76. Second output buffer 76 thus stops operating.

As a result of the above, if address signal ADD7 is at L level when the mode register set command is issued, output buffer 34 outputs only external data signal EXTDQ. At this time, therefore, semiconductor memory device 20 corresponds to the single data bus.

Consequently, output buffer 34 can also select whether to output the external data signals to the single bus or the complementary data buses by control signals ENC and END outputted from read select circuit 77 in control circuit 24. It is, therefore, possible to correspond to various types of data processing systems.

By adopting the above-mentioned configuration, the output buffer can output the external data signals to the single data bus or the complementary data buses in response to the type of the data processing system.

Second Embodiment

The semiconductor memory device in the first embodiment includes two input buffers so as to be able to correspond to both the single data bus and the complementary data buses. In this case, however, the number of the circuit elements of the input buffers is doubled from that of the conventional art, which contradicts the intention to reduce an area occupied by the semiconductor memory device. It is, therefore, preferable that fewer circuit elements are used.

Figure 7:
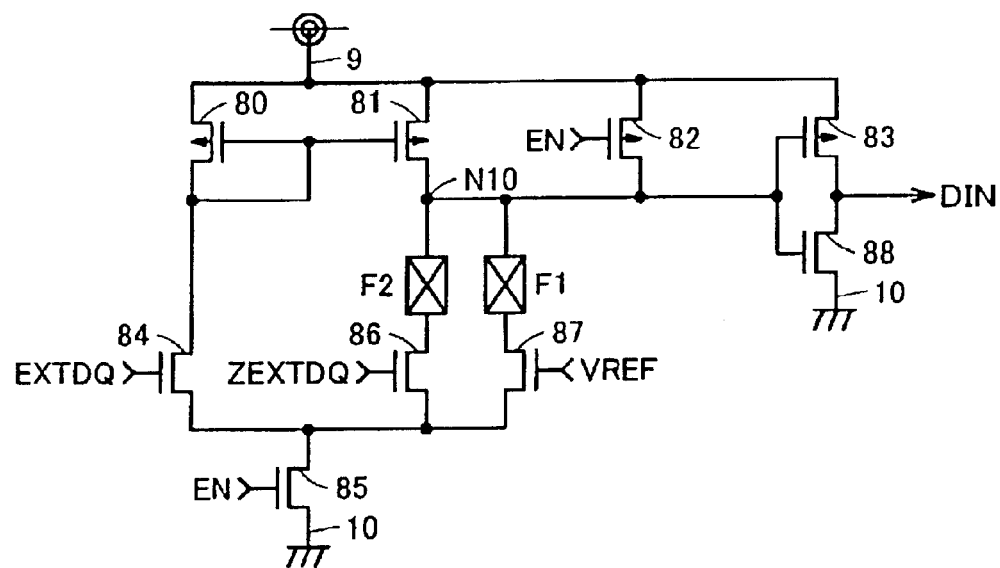
FIG. 7 is a circuit diagram showing the configuration of an input buffer in the second embodiment of the present invention.

FIG. 7 is a circuit diagram showing the configuration of an input buffer in the second embodiment of the present invention.

Referring to FIG. 7, input buffer 32 includes P-channel MOS transistors 80 to 83, N-channel MOS transistors 84 to 88 and fuses F1 and F2.

P-channel MOS transistor 80 and N-channel MOS transistors 84 and 85 are connected in series between internal power supply potential node 9 and ground power supply node 10. P-channel MOS transistor 80 is diode-connected.

In addition, P-channel MOS transistor 81, fuse F2 and N-channel MOS transistor 86 are connected in series between internal power supply potential node 9 and N-channel MOS transistor 85. The gate of P-channel MOS transistor 81 is connected to that of P-channel MOS transistor 80. Further, fuse F1 and N-channel MOS transistor 87 are connected in series between a node N10 and N-channel MOS transistor 85. P-channel MOS transistor 82 is connected between internal power supply potential node 9 and node N10.

P-channel MOS transistor 83 and N-channel MOS transistor 88 are connected in series between internal power supply potential node 9 and ground power supply node 10, and the gates thereof are both connected to node N10.

Control signal EN is inputted into the gates of P-channel MOS transistor 82 and N-channel MOS transistor 85. In addition, external data signal EXTDQ is inputted into the gate of N-channel MOS transistor 84, external data signal ZEXTDQ is inputted into the gate of N-channel MOS transistor 86, and reference potential VREF is inputted into the gate of N-channel MOS transistor 87. Input buffer 32 outputs internal data signal DIN.

The operation of input buffer 32 having the above-mentioned configuration will be described.

First, a case where input buffer 32 receives only external data signal EXTDQ from a single bus will be described.

At this time, fuse F2 is cut off in input buffer 32 in response to the signal outputted from control circuit 24. As a result, input buffer 32 compares external data signal EXTDQ with reference potential VREF and outputs the comparison result as internal data signal DIN.

Next, a case where input buffer 32 receives complementary external data signals EXTDQ and ZEXTDQ from complementary data buses will be described.

At this time, fuse F1 is cut off in input buffer 32 in response to the signal outputted from control circuit 24. As a result, input buffer 32 outputs internal data signal DIN in response to complementary external data signals EXTDQ and ZEXTDQ.

Consequently, by employing the input buffer having the above-mentioned configuration, it is possible to decrease the number of the circuit elements of the input buffer compared with that of the semiconductor memory device in the first embodiment.

In the first embodiment, the read select circuit which employs the logic gates controls output buffer 34. It is also possible to control output buffer 34 by employing fuses in the read select circuit.

Figure 8:
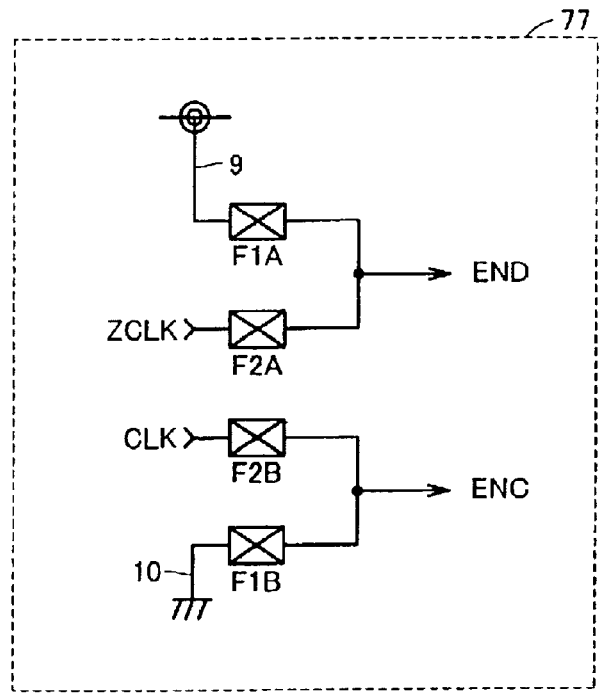
FIG. 8 is a circuit diagram showing the configuration of a read select circuit in the second embodiment.

FIG. 8 is a circuit diagram showing the configuration of a read select circuit in the second embodiment.

Referring to FIG. 8, a read select circuit 77 includes fuses F1A, F2A, F2B and F1B. Fuse F1A is connected to internal power supply potential node 9. Fuse F2A inputs clock signal ZCLK. Fuse F2B inputs clock signal CLK and fuse F1B is connected to ground potential node 10.

If output buffer 34 outputs external data signal EXTDQ to the single data bus, fuses F2A and F2B are cut off. As a result, the level of control signal END becomes H level and that of control signal ENC becomes L level. Second output buffer 76 does not, therefore, operate. As a result, by allowing first output buffer 75 to operate, external data signal EXTDQ can be outputted to the single data bus.

On the other hand, if output buffer 34 outputs complementary external data signals EXTDQ and ZEXTDQ to the complementary data buses, fuses F1A and F1B are cut off. As a result, clock signal ZCLK is outputted as control signal END and clock signal CLK is outputted as control signal ENC. Consequently, both first output buffer 75 and second output buffer 76 operate and output complementary external data signals EXTDQ and ZEXTDQ to the complementary data bus, respectively.

As can be seen, even if the read select circuit has a structure of using fuses, the output buffer can output the external data signal or external data signals to either the single data bus or the complementary data buses in response to the type of the data processing system.

Third Embodiment

Figure 9:
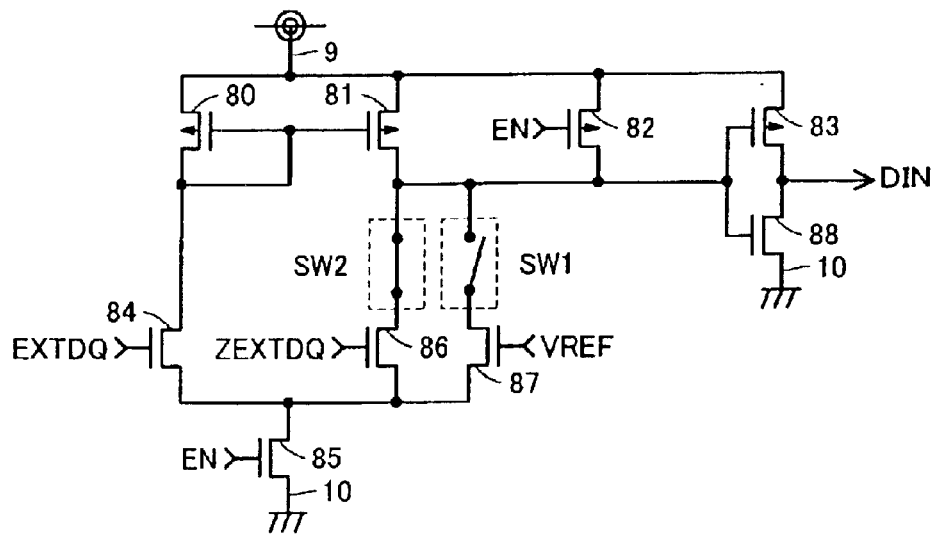
FIG. 9 is a circuit diagram showing the configuration of an input buffer in the third embodiment of the present invention.

FIG. 9 is a circuit diagram showing the configuration of an input buffer in the third embodiment of the present invention.

Referring to FIG. 9, compared with FIG. 7, input buffer 32 shown therein is constituted to arrange a switch circuit SW1 in place of fuse F1 and a switch circuit SW2 in place of fuse F2. Since the remaining circuit configuration is the same as that shown in FIG. 7, it will not be repeatedly described herein.

Switch circuits SW1 and SW2 are controlled by a switch signal outputted from control circuit 24.

The operation of the input buffer having the above-mentioned circuit configuration will be described.

If input buffer 32 receives external data signal EXTDQ from a single data bus, switch circuit SW1 is turned on by the switch signal outputted from control cricuit 24. In addition, switch circuit SW2 is turned off by the switch signal outputted from control circuit 24. As a result, input buffer 32 compares external data signal EXTDQ with reference potential VREF, and outputs the comparison result as internal data signal DIN.

Further, if input buffer 32 receives complementary external data signals EXTDQ and ZEXTDQ from complementary data buses, switch circuit SW1 is turned off and switch circuit SW2 is turned on by the switch signal outputted from control circuit 24. As a result, input buffer 32 outputs internal data signal DIN based on complementary external data signals EXTDQ and ZEXTDQ.

Consequently, even if the input buffer is constituted to include switch circuits instead of the fuses, the input buffer can correspond to the single data bus and the complementary data buses.

Figure 10:
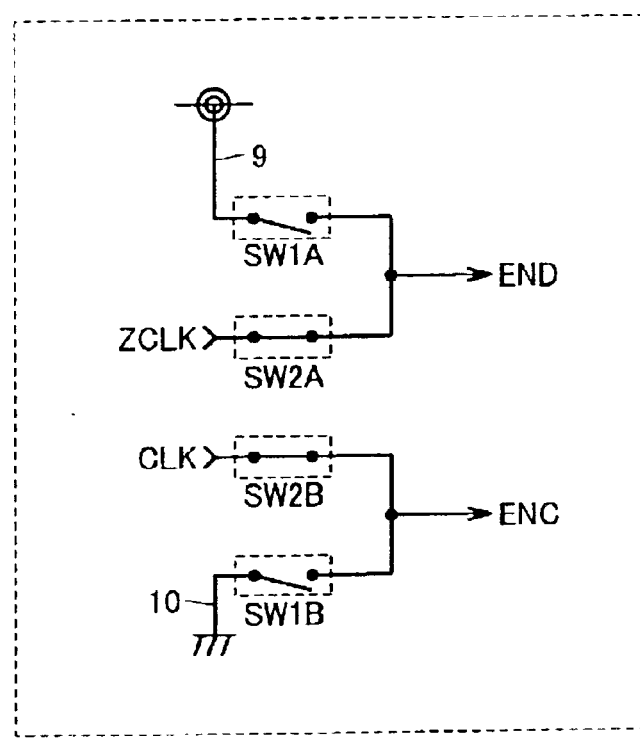
FIG. 10 is a circuit diagram showing the configuration of a read select circuit in the third embodiment.

FIG. 10 is a circuit diagram showing the configuration of a read select circuit in the third embodiment.

Referring to FIG. 10, compared with FIG. 8, read select circuit 77 includes switch circuits SW1A, SW2A, SW2B and SW1B in place of fuses F1A, F2A, F2B and F1B, respectively.

If output buffer 34 outputs external data signal EXTDQ to the single data bus, switch circuits SW2A and SW2B are turned off by the switch signal outputted from control circuit 24. Switch circuits SW1A and SW1B are turned on by the switch signal outputted from control circuit 24. As a result, the level of control signal END becomes H level and that of control signal ENC becomes L level. Second output buffer 76, therefore, stops operating. Consequently, external data signal EXTDQ is outputted to the single data bus by the operation of first output buffer 75. At this time, therefore, output buffer 34 operates to correspond to the single data bus.

On the other hand, if output buffer 34 outputs complementary external data signals EXTDQ and ZEXTDQ to the complementary data buses, switch circuits SW1A and SW1B are turned off and switch circuits SW2A and SW2B are turned on. As a result, clock signal ZCLK is outputted as control signal END and clock signal CLK is outputted as control signal ENC. Therefore, both first output buffer 75 and second output buffer 76 operate and output complementary external data signals EXTDQ and ZEXTDQ to the complementary data buses, respectively. At this moment, therefore, output buffer 34 operates to correspond to the complementary data buses.

As can be seen from the above, even if the read select circuit has a structure of using switch circuits, the output buffer can output the external data signal or external data signals to the single data bus or the complementary data buses in response to the type of the data processing system.

Fourth Embodiment

Figure 11:
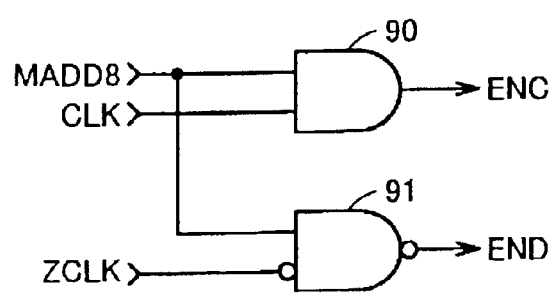
FIG. 11 is a circuit diagram showing the configuration of a read select circuit in the fourth embodiment of the present invention.

FIG. 11 is a circuit diagram showing the configuration of a read select circuit in the fourth embodiment of the present invention.

Referring to FIG. 11, read select circuit 77 includes logic gates 90 and 91 similarly to FIG. 6. Logic gate 90 receives a signal MADD8 and clock signal CLK, and outputs an AND logic operation result as control signal ENC. Logic gate 91 receives signal MADD8 and the inverted signal of clock signal ZCLK, and outputs a NAND logic operation result as control signal END. Here, signal MADD8 is a signal which is generated by write select circuit 36 and generated based on address signal ADD8.

The operation of the semiconductor memory device if input buffer 32 shown in FIG. 3 is controlled using write select circuit 36 shown in FIG. 4 and output buffer 34 shown in FIG. 5 is controlled using read select circuit 77 shown in FIG. 11 will, be described.

First, a case where the semiconductor memory device corresponds to the single data bus only during a write operation and corresponds to complementary data buses in a read operation, will be described.

In this case, during the write operation, the level of address signal ADD7 becomes L level. As a result, input buffer 100 operates and input buffer 101 stops operating in input buffer 32. Therefore, in the write operation, the semiconductor memory device corresponds to the single data bus.

In addition, in the read operation, the level of address signal ADD8 becomes H level. As a result, the level of control signal ENC becomes H level and that of control signal END becomes L level synchronously with clock signal CLK. Consequently, both first output buffer 75 and second output buffer 76 operate. During the read operation, therefore, the semiconductor memory device corresponds to the complementary data buses.

Next, a case where the semiconductor memory device corresponds to the complementary data buses during the write operation and corresponds to the single data bus during the read operation, will be described.

In this case, during the write operation, the level of address signal ADD7 becomes H level. As a result, both input buffers 100 and 101 operate in input buffer 32. During the write operation, therefore, the semiconductor memory device can correspond to the complementary data buses.

Further, during the read operation, the level of address signal ADD8 becomes L level. As a result, the level of control signal ENC becomes L level and that of control signal END becomes H level synchronously with clock signal CLK. Consequently, first output buffer 75 operates and second output buffer 76 stops operating. During the read operation, therefore, the semiconductor memory device can correspond to the single data bus.

If the semiconductor memory device corresponds to the complementary data buses during both the write operation and the read operation by the same methods, both address signals ADD7 and ADD8 may be set at H level.

If the semiconductor memory device corresponds to the single data bus during both the write operation and the read operation by the same method, both address signals ADD7 and ADD8 may be set at L level.

As can be seen from the above, the semiconductor memory device in the fourth embodiment of the present invention can select whether to correspond to the single data bus or the complementary data buses in response to the write operation and the read operation. It is, therefore, possible to increase the degree of freedom for the design of the data processing system.

Fifth Embodiment

Figure 12:
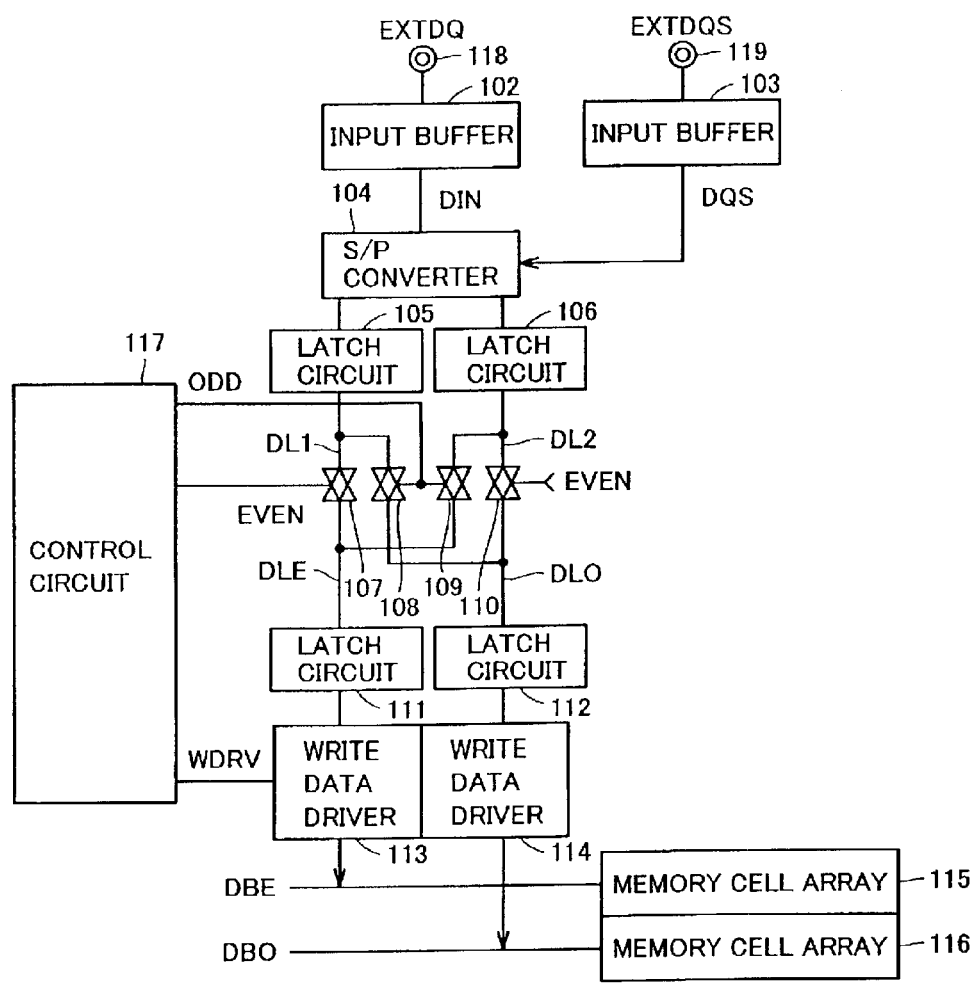
FIG. 12 is a schematic block diagram showing the overall configuration of a DDR-SDRAM.

FIG. 12 is a schematic block diagram showing the overall configuration of DDR-SDRAM.

Referring to FIG. 12, DDR-SDRAM includes input buffers 102 and 103, a serial/parallel converter 104, latch circuits 105, 106, 111 and 112, transmission gates 107 to 110, write data driver 113 and 114, memory cell arrays 115 and 116, and a control circuit 117.

Input buffer 102 receives external data signal EXTDQ from an external data signal input terminal 118, and outputs internal data signal DIN. Input buffer 103 receives an external data strobe signal EXTDQS from an external data strobe signal input terminal 119, and outputs an internal data strobe signal DQS.

Serial/parallel converter 104 receives internal data signal DIN and internal data strobe signal DQS, and separates internal data signal DIN into data signals DL1 and DL2 based on internal data strobe signal DQS.

Latch circuit 105 latches data signal DL1 outputted from serial/parallel converter 104. Latch circuit 106 latches data signal DL2 outputted from serial/parallel converter 104.

Transmission gate 107 is connected between latch circuits 105 and 111 and turned on when a switch signal EVEN is at H level. Transmission gate 108 is connected between latch circuits 106 and 112 and turned on when a switch signal ODD is at H level. Transmission gate 109 is connected between latch circuits 105 and 111 and turned on when switch signal ODD is at H level. Transmission gate 110 is connected between latch circuits 106 and 112 and turned on when switch signal EVEN is at H level. It is noted that switch signals EVEN and ODD are signals outputted from control circuit 117. Control circuit 117 is a circuit for controlling overall DDR-SDRAM and outputs an internal clock signal int.CLK. In addition, control circuit 117 outputs a write operation signal WRITE for indicating a write operation.

The output terminal of latch circuit 111 is connected to the input terminal of a write data driver 113. The output terminal of latch circuit 112 is connected to the input terminal of a write data driver 114. When the level of a write data driver activation signal WDRV becomes H level, write data driver 113 outputs data latched by latch circuit 111 to memory cell array 115. When the level of write data driver activation signal WDRV becomes H level, write data driver 114 outputs data latched by latch circuit 112 to memory cell array 116. It is noted that write data driver activation signal WDRV is a signal outputted from control circuit 117.

Figure 13:
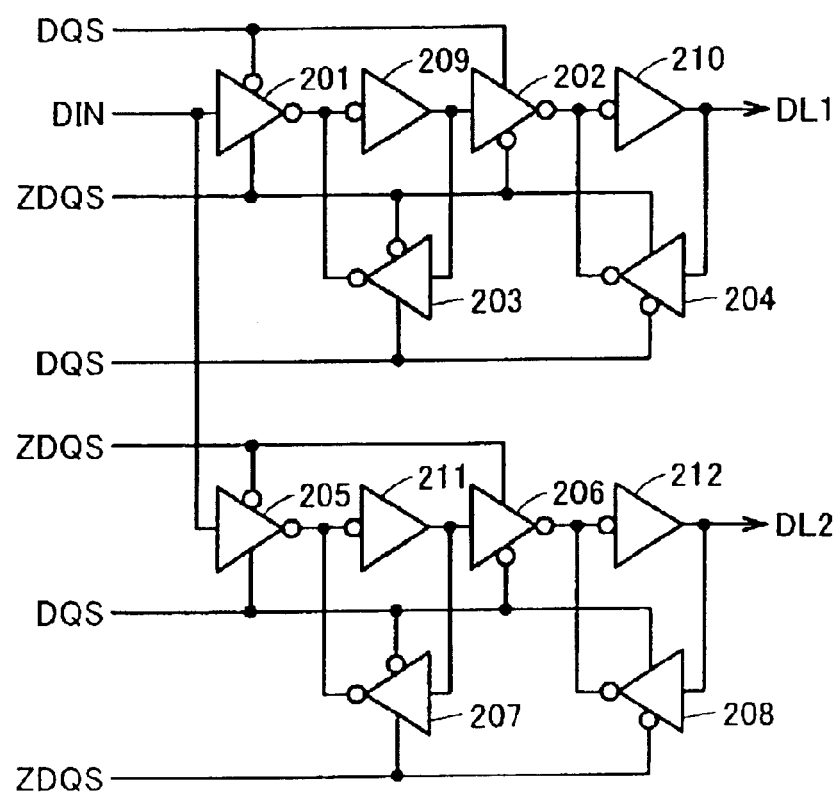
FIG. 13 is a circuit diagram showing the configuration of a serial/parallel converter shown in FIG. 12.

FIG. 13 is a circuit diagram showing the configuration of serial/parallel converter 104 shown in FIG. 12.

Referring to FIG. 13, serial/parallel 104 includes clocked inverters 201 to 208 and inverters 209 to 212.

Clocked inverter 201, inverter 209, clocked inverter 202 and inverter 210 are connected in series. Internal data signal DIN is inputted into the input terminal of clocked inverter 201. In addition, signal DL1 is outputted from inverter 210. When internal data strobe signal DQS is at L level, clocked inverter 201 operates. When internal data strobe signal DQS is at H level, clocked inverter 202 operates.

The input terminal of clocked inverter 203 is connected to the output terminal of inverter 209 and the output terminal of clocked inverter 203 is connected to the input terminal of inverter 209. The input terminal of clocked inverter 204 is connected to the output terminal of inverter 210 and the output terminal of clocked inverter 204 is connected to the input terminal of inverter 210.

When internal data strobe signal DQS is at H level, clocked inverter 203 operates. When an internal data strobe signal ZDQS is at L level, clocked inverter 204 operates.

Clocked inverter 205, inverter 211, clocked inverter 206 and inverter 212 are connected in series. Internal data signal DIN is inputted into the input terminal of clocked inverter 205. In addition, signal DL2 is outputted from inverter 212. When internal data strobe signal DQS is at L level, clocked inverter 205 operates. When internal data strobe signal DQS is at H level, clocked inverter 206 operates.

The input terminal of clocked inverter 207 is connected to the output terminal of inverter 211 and the output terminal of clocked inverter 207 is connected to the input terminal of inverter 211. The input terminal of clocked inverter 208 is connected to the output terminal of inverter 212 and the output terminal of clocked inverter 208 is connected to the input terminal of inverter 212.

When internal data strobe signal DQS is at H level, clocked inverter 207 operates. When an internal data strobe signal ZDQ is at L level, clocked inverter 208 operates.

The operation of DDR-SDRAM having the above-mentioned configuration will be described.

Figure 14:
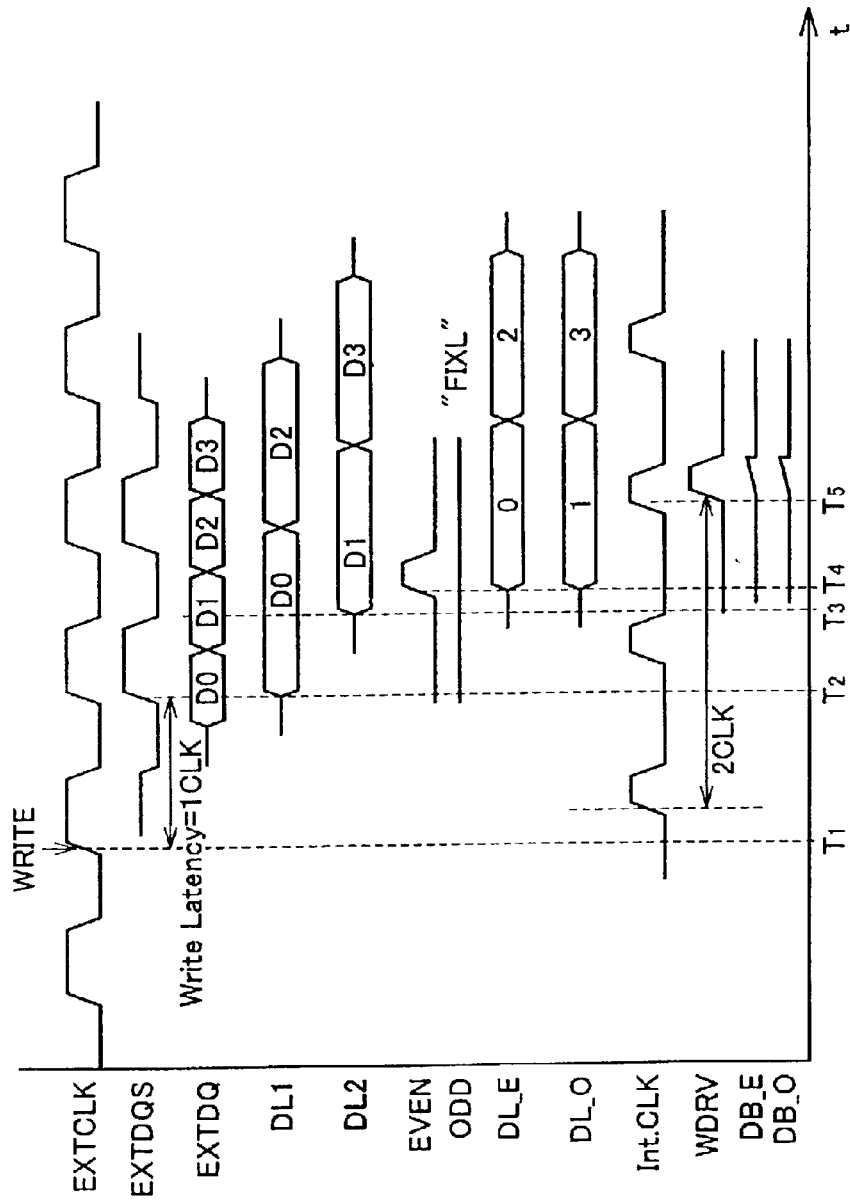
FIG. 14 is a timing chart showing the write operation of DDR-SDRAM shown in FIG. 12.

FIG. 14 is a timing chart showing the operation of DDR-SDRAM shown in FIG. 12 during a write operation.

Referring to FIG. 14, if write latency is set at 1, write operation signal WRITE is outputted from control circuit 117 at time T1. At time T2 after the passage of one clock of external clock signal EXTCLK from time T1, serial/parallel converter 104 latches data D0 in external data signal EXTDQ (internal data signal DIN) in response to the rise of data strobe signal DQS, and outputs data D0 to latch circuit 105. Further, at time T3 at which data strobe signal DQS falls after time T2, serial/parallel converter 104 latches data D1 from external signal EXTDQ (internal data signal DIN), and outputs data D1 to latch circuit 106. Likewise, serial/parallel converter 104 outputs data D2n (where n is a natural number) latched from external data signal EXTDQ (internal data signal DIN) at the rise of external data strobe signal EXTDQS to latch circuit 105, and outputs data $D_{2+1}$ (where n is a natural number) latched from internal data signal DIN at the fall of internal data strobe signal DQS, to latch circuit 106.

Here, at time T4, control circuit 117 activates switch signal EVEN to H level and keeps switch signal ODD at L level. At this time, transmission gates 107 and 110 are turned on and transmission gates 108 and 109 are turned off. Therefore, data D0 latched by latch circuit 105 is latched by latch circuit 111 at time T4. Likewise, data D1 latched by latch circuit 106 is latched by latch circuit 112.

Next, at time T5, when write data driver activation signal WDRV is activated to H level, write data driver 113 outputs data D0 latched by latch circuit 111 to memory cell array 115 and write data driver 114 outputs data D1 latched by latch circuit 112 to memory cell array 116.

At time T4 at which switch signal EVEN is set at L level and switch signal ODD is set at H level, transmission gates 107 and 110 are turned off and transmission gates 108 and 109 are turned on. As a result, data D0 is latched by latch circuit 112 and data D1 is latched by latch circuit 111.

As described above, during the write operation of DDR-SDRAM, serial/parallel converter 104 receives different data at the rise and fall of internal data strobe signal DQS (external data strobe signal), respectively. As a result, a timing margin is quite strict.

Figure 15:
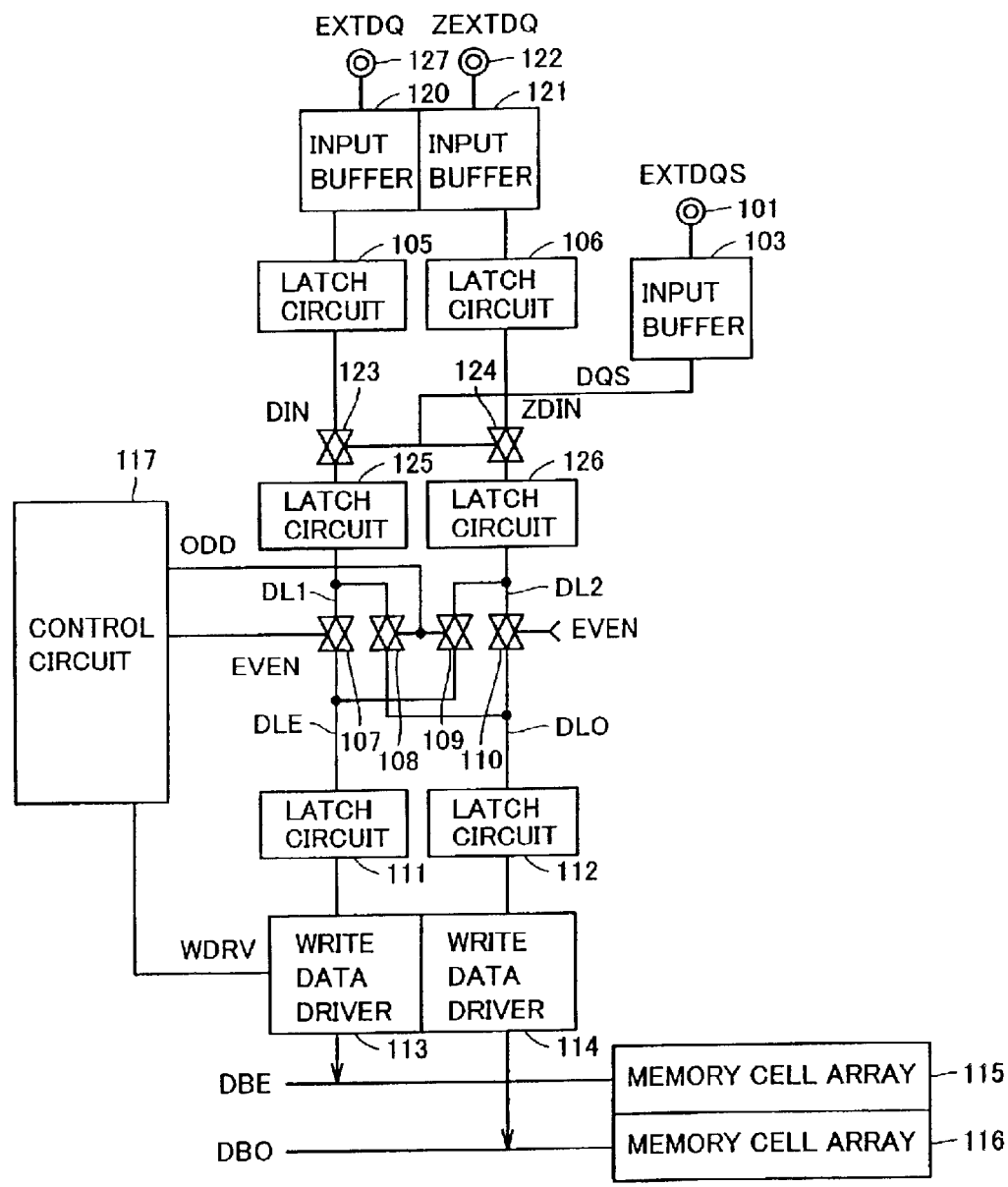
FIG. 15 is a schematic block diagram showing the overall configuration of DDR-SDRAM in the fifth embodiment of the present invention.

FIG. 15 is a schematic block diagram showing the overall configuration of DDR-SDRAM in the fifth embodiment of the present invention.

Referring to FIG. 15, compared with FIG. 12, input buffers 120 and 121 are provided in place of input buffer 102, and transmission gates 123 and 124 are grounded in place of serial/parallel converter 104. Further, a latch circuit 125 is added between transmission gates 123 and 107 and a latch circuit 126 is added between transmission gates 124 and 110.

Input buffer 120 receives external data signal EXTDQ from an external data signal input terminal 127, and outputs internal data signal DIN to latch circuit 105. Input buffer 121 receives external data signal ZEXTDQ inputted from an external data signal input terminal 122, and outputs internal data signal ZDIN to latch circuit 106. Here, external data signal ZEXTDQ is a complementary signal to external data signal EXTDQ. Therefore, internal data signal ZDIN is a complementary signal to internal data signal DIN.

A transmission gate 123 is connected between latch circuit 105 and transmission gate 107 and turned on when internal data strobe signal DQS is at H level. In addition, transmission gate 124 is connected between latch circuit 106 and transmission gate 110 and turned on when internal data strobe signal DQS is at H level.

Since the remaining circuit configuration is the same as that shown in FIG. 12, it will not be repeatedly described herein.

The write operation of DDR-SDRAM having the above-mentioned circuit configuration will be described.

Figure 16:
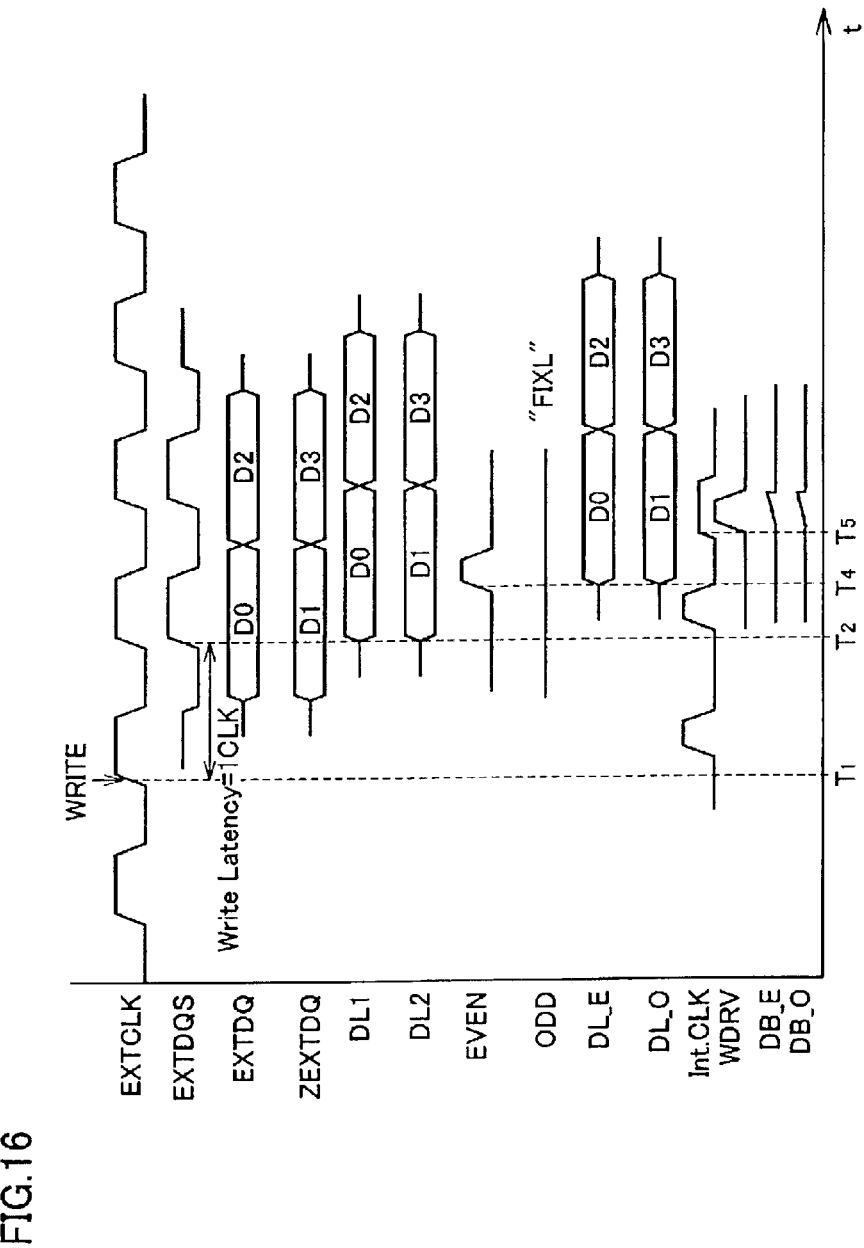
FIG. 16 is a timing chart for showing the write operation of DDR-SDRAM shown in FIG. 15.

FIG. 16 is a timing chart showing the write operation of DDR-SDRAM shown in FIG. 15.

Referring to FIG. 16, DDR-SDRAM in the fifth embodiment receives complementary external data signals EXTDQ and ZEXTDQ. As a result, if acquiring the same quantity of data as conventional DDR-SDRAM, the timing margin of DDR-SDRAM when acquiring the data can be set twice as wide as that of conventional DDR-SDRAM.

Specifically, as shown in FIG. 14, since DDR-SDRAM shown in FIG. 12 receives data from single external data signal EXTDQ, it is necessary that external data signal EXTDQS differs between the rise and the fall of external strobe signal EXTDQS. However, since DDR-SDRAM in the fifth embodiment of the present invention has two external data signals for transmitting data, it suffices that the quantity of data transmitted by conventional external data signal EXTDQ may be equally shared between external data signals EXTDQ and ZEXTDQ. It is, therefore, possible to double time for holding the information of the same data Dn on the data signal.

Therefore, external data signal EXTDQ transports data D0 and D2 and external data signal ZEXTDQ transports data D1 and D3.

Control circuit 117 outputs write operation signal WRITE at time T1. At time T2 after the passage of one clock of external clock signal EXTCLK from time T1, input buffer 120 acquires data D0 from external data signal EXTDQ and input buffer 121 acquires data D1 from external data signal ZEXTDQ.

At this moment, the level of internal data strobe signal DQS outputted from input buffer 103 becomes H level. Therefore, transmission gates 123 and 124 are turned on. As a result, data D0 acquired by input buffer 121 is latched by latch circuit 125 and data D1 acquired by input buffer 121 is latched by latch circuit 126.

Since the following operation is the same as the operation after time T4 shown in FIG. 14, it will not be repeatedly described herein.

Consequently, in DDR-SDRAM in the fifth embodiment of the present invention, by using the complementary external data signals, it is possible to set data rate at a single data rate without decreasing the data rate. It is, therefore, possible to dispense with the serial/parallel converter, thereby simplifying the circuit configuration of DDR-SDRAM.

Furthermore, it is possible to relax the timing margin which is restricted due to the operation of the serial/parallel converter.

Sixth Embodiment

Figure 17:
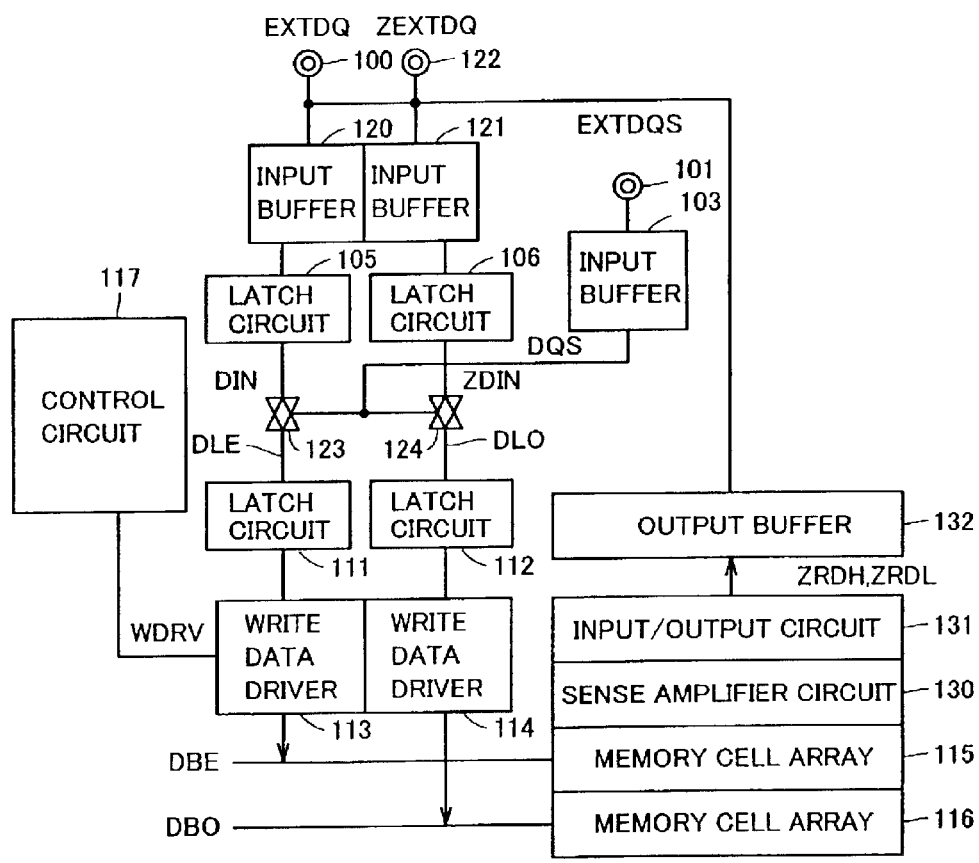
FIG. 17 is a schematic block diagram showing the configuration of DDR-SDRAM in the sixth embodiment of the present invention.

FIG. 17 is a schematic block diagram showing the configuration of DDR-SDRAM in the sixth embodiment of the present invention.

Referring to FIG. 17, compared with FIG. 15, transmission gates 107 to 110 and latch circuits 125 and 126 are deleted. Since the remaining circuit configuration is the same as that shown in FIG. 15, it will not be repeatedly described herein.

Figure 18:
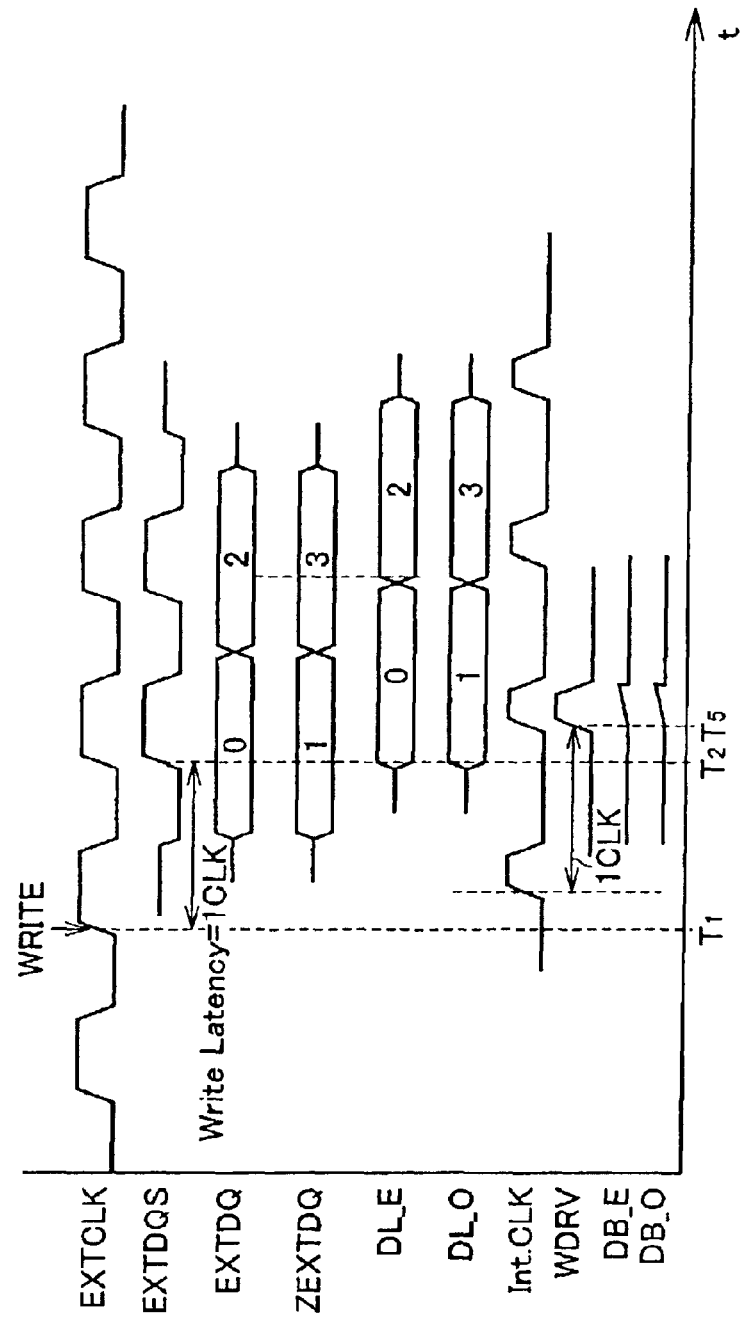
FIG. 18 is a timing chart for showing the write operation of DDR-SDRAM shown in FIG. 17.

FIG. 18 is a timing chart showing the write operation of DDR-SDRAM shown in FIG. 17.

Referring to FIG. 18, at time T1, write operation signal WRITE is outputted from control circuit 117. If write latency is set at 1 clock, at time T2 after the passage of one clock of external clock signal EXTCLK from time T1, input buffer 120 acquires data D0 from external data signal EXTDQ and outputs data D0 to latch circuit 105. In addition, at time T2, input buffer 121 acquires data D1 from external data signal ZEXTDQ and outputs data D1 to latch circuit 106. Therefore, latch circuits 105 and 106 latch data D0 and D1, respectively.

At time T2, data strobe signal DQS is activated to H level and transmission gates 123 and 124 are, therefore, turned on. As a result, at time T2, data signals D0 and D1 are latched by data circuits 111 and 112, respectively.

At time T5 after time T2, write data driver activation signal WDRV is activated in response to the rise of internal clock signal int.CLK. As a result, data signal D0 latched by latch circuit 111 is outputted to memory cell array 115 and data signal D1 latched by latch circuit 112 is outputted to memory cell array 116.

In the semiconductor memory device in the sixth embodiment of the present invention, the transmission gates for determining data inputted from the two input buffers is outputted to which memory array in a plurality of memory cell arrays are deleted. As a result, time can be shortened by as much as time which would be required to operate the transmission gates.

Figure 19:
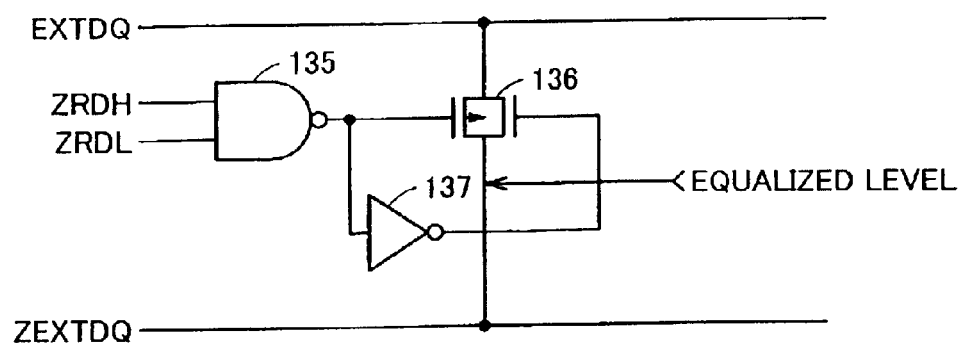
FIG. 19 is a circuit diagram of an equalization circuit for complementary data buses used in the semiconductor memory device shown in FIG. 17.

FIG. 19 is a circuit diagram of an equalizer for the complementary data buses used in the semiconductor memory device shown in FIG. 17.

Referring to FIG. 19, the equalizer includes a logic gate 135, a transmission gate 136 and an inverter 137.

Logic gate 135 receives read signals ZRDH and ZRDL outputted from an input/output circuit 131, and outputs a NAND logic operation result. Inverter 137 receives and inverts the output signal of logic gate 135, and outputs the inverted signal. Transmission gate 136 is connected between the output terminal of logic gate 135 and the output terminal of inverter 137. Transmission gate 136 causes a short-circuit on the complementary data buses when the output signal of logic gate 135 is at L level.

When no read operation is performed, read signals ZRDH and ZRDL are both at H level. At this time, therefore, transmission gate 136 is turned on and the complementary data buses are short-circuited. The voltages of the complementary data buses at this time are held to equalized level. The equalized level is assumed to one of ground potential GND, internal power supply potential VCC and VCC/2.

Figure 20:
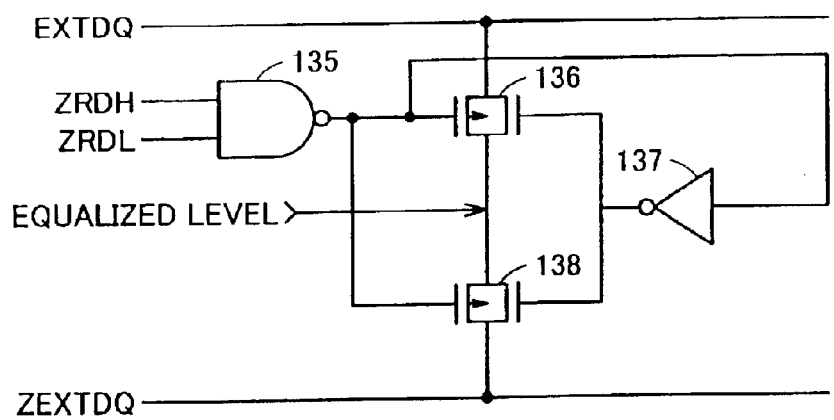
FIG. 20 is a circuit diagram showing another example of the equalization circuit for the complementary data buses used in the semiconductor memory device shown in FIG. 17.

FIG. 20 is a circuit diagram showing another example of the equalization circuit for the complementary data buses used in the semiconductor memory device shown in FIG. 17.

Referring to FIG. 20, compared with FIG. 19, a transmission gate 138 is newly added to the equalization circuit. Transmission gate 138 is connected between the output terminal of logic gate 135 and that of inverter 137. If both transmission gates 136 and 138 are turned on, the complementary data buses are short-circuited and the potentials of the both complementary data buses are held to equalized level.

By adopting the above-mentioned configuration, the potentials of the complementary data buses are held to one of ground potential GND, internal power supply potential VCC and VCC/2 except for the write operation and the read operation.

Seventh Embodiment

Figure 21:
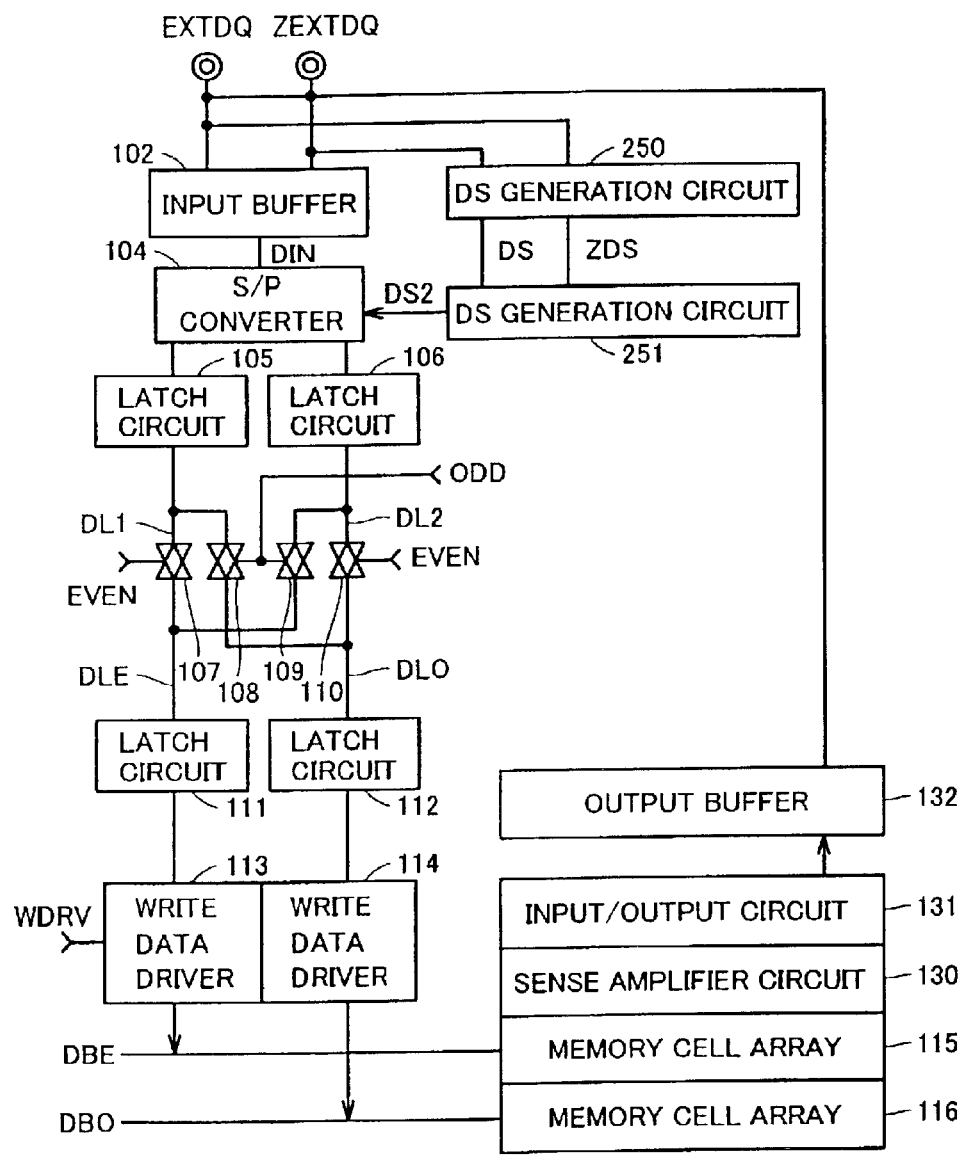
FIG. 21 is a block diagram showing the configuration of a semiconductor memory device in the seventh embodiment of the present invention.

FIG. 21 is a block diagram showing the configuration of a semiconductor memory device in the seventh embodiment of the present invention.

Referring to FIG. 21, compared with FIG. 12, a first data strobe signal generation circuit (to be referred to as "DS generation circuit" hereinafter) 250 and a second data strobe signal generation circuit (to be referred to as "DS2 generation circuit" hereinafter) 251 are newly added to the semiconductor memory device in place of input buffer 103.

DS generation circuit 250 receives complementary external data signals EXTDQ and ZEXTDQ, and outputs first data strobe signals DS and ZDS. DS2 generation circuit 251 receives first data strobe signals DS and ZDS, and outputs a second data strobe signal DS2.

Figure 22:
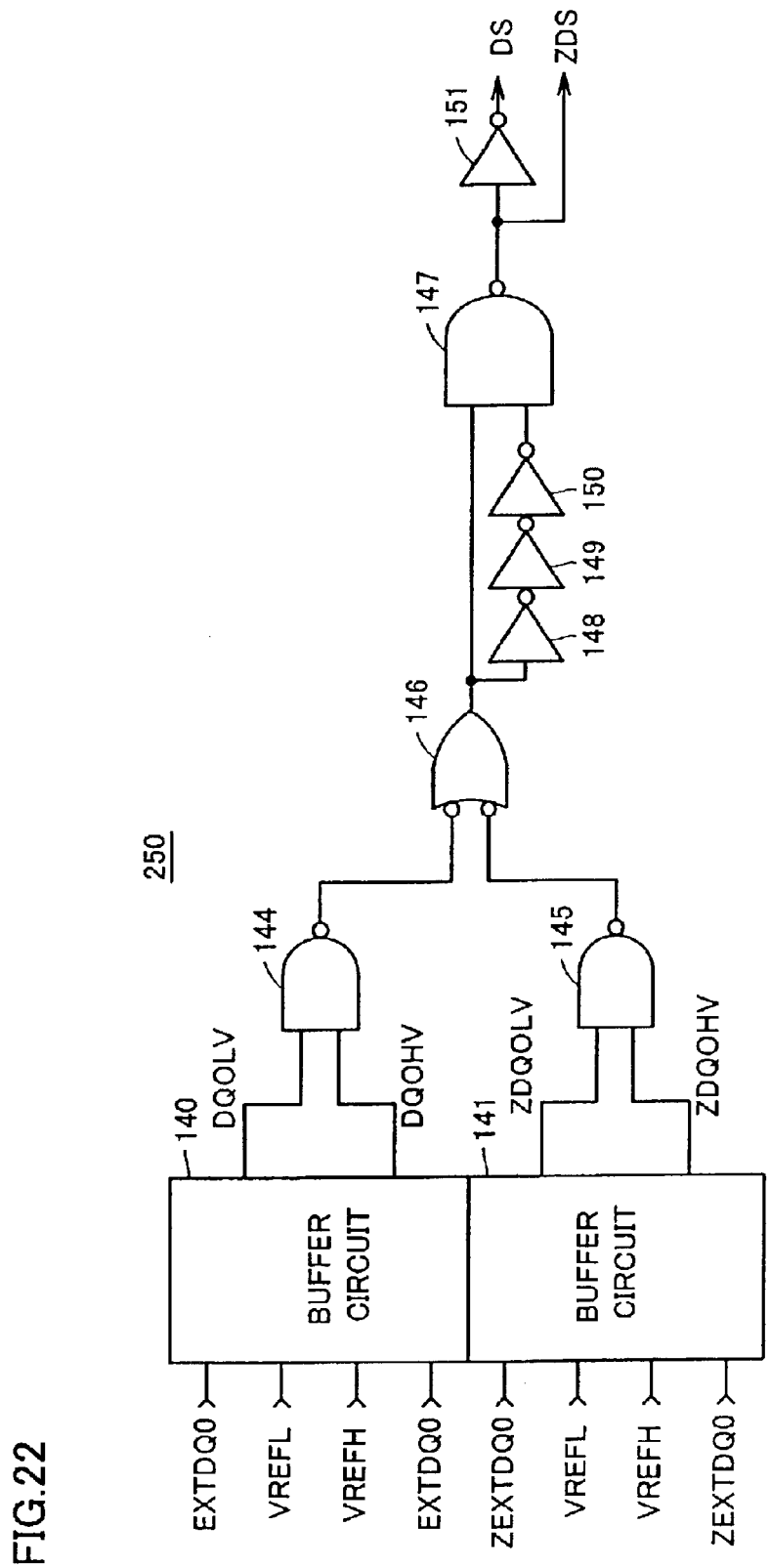
FIG. 22 is a circuit diagram showing the configuration of a DS generation circuit shown in FIG. 21.

FIG. 22 is a circuit diagram showing the configuration of DS generation circuit 250 shown in FIG. 21.

Referring to FIG. 22, DS generation circuit 250 includes buffer circuits 140 and 141, logic gates 144 to 147, and inverters 148 to 151.

Figure 23:
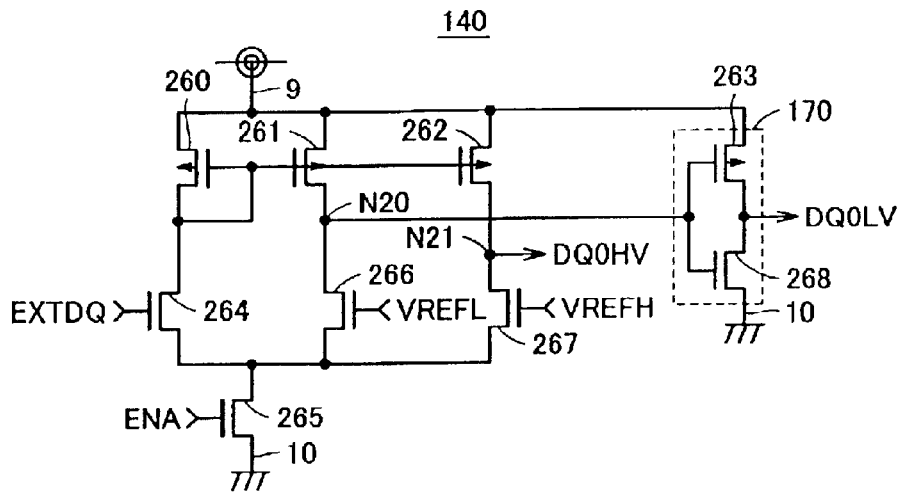
FIG. 23 is a circuit diagram showing the configuration of a buffer circuit shown in FIG. 22.

FIG. 23 is a circuit diagram showing the configuration of buffer circuit 140 shown in FIG. 22.

Referring to FIG. 23, buffer circuit 140 includes P-channel MOS transistors 260 to 263 and N-channel MOS transistors 264 to 268.

P-channel MOS transistor 260 and N-channel MOS transistors 264 and 265 are connected in series between internal power supply potential node 9 and ground potential node 10. P-channel MOS transistor 260 is diode-connected. In addition, external data signal EXTDQ is inputted into the gate of N-channel MOS transistor 264. Control signal ENA outputted from control circuit 117 is inputted into the gate of N-channel MOS transistor 265.

Further, P-channel MOS transistor 261 and N-channel MOS transistor 266 are connected in series between internal power supply potential node 9 and ground potential node 10. The gate of P-channel MOS transistor 261 is connected to the gate of P-channel MOS transistor 260. Therefore, P-channel MOS transistors 260 and 261 constitute a current mirror circuit. A reference potential VREFL is inputted into the gate of N-channel MOS transistor 266. Here, reference potential VREFL is a reference potential obtained by dividing reference potential VREF according to resistance and lower than reference potential VREF by micro-potential ΔV. Micro-potential ΔV is, for example, 10 mV.

P-channel MOS transistor 262 and N-channel MOS transistor 267 are connected in series between internal power supply potential node 9 and N-channel MOS transistor 265. The gate of P-channel MOS transistor 262 is connected to the gate of P-channel MOS transistor 260. Therefore, P-channel MOS transistors 260 and 262 constitute a current mirror circuit. Further, a reference potential VREFH is inputted into the gate of N-channel MOS transistor 267. Here, reference potential VREFH is a reference potential obtained by dividing reference potential VREF according to resistance and higher than reference potential VREF by micro-potential ΔV. Micro-potential ΔV is, for example, 10 mV. A signal DQ0HV is outputted from a node N21 which is the connection point between P-channel MOS transistor 262 and N-channel MOS transistor 267.

P-channel MOS transistor 263 and N-channel MOS transistor 268 constitute an inverter 170. Inverter 170 receives and inverts a signal outputted from a node N20 which is the connection point between P-channel MOS transistor 261 and N-channel MOS transistor 266, and outputs a signal DQ0LV.

Since the configuration of buffer circuit 141 is the same as that of buffer circuit 140, it will not be repeatedly described herein. External signal ZEXTDQ is inputted into the gate of N-channel MOS transistor 264 in buffer circuit 141. In addition, signal ZDQ0HV is outputted from node N21 and signal ZDQ0LV is outputted from inverter 170.

Referring back to FIG. 22, logic gate 144 receives signals DQ0LV and DQ0HV outputted from buffer circuit 140, and outputs a NAND logic operation result. In addition, logic gate 145 receives signals ZDQ0LV and ZDQ0HV outputted from buffer circuit 141, and outputs a NAND logic operation result.

Logic gate 146 receives the output signals of logic gates 144 and 145, and outputs a NAND logic operation result. Inverters 148 to 150 are connected in series. The input terminal of inverter 148 is connected to the output terminal of logic gate 146. The output terminal of inverter 150 is connected to one of the two input terminals of logic gate 147. The other input terminal of logic gate 147 is connected to the output terminal of logic gate 146. Logic gate 147 receives the output signal of logic gate 146 and that of inverter 150, and outputs a NAND logic operation result as a first data strobe signal ZDS. Since inverters 148 to 150 function as delay elements, logic gate 147 outputs a one-shot pulse as the first data strobe signal.

Inverter 151 receives and inverts first data strobe signal ZDS, and outputs first data strobe signal DS.

Figure 24:
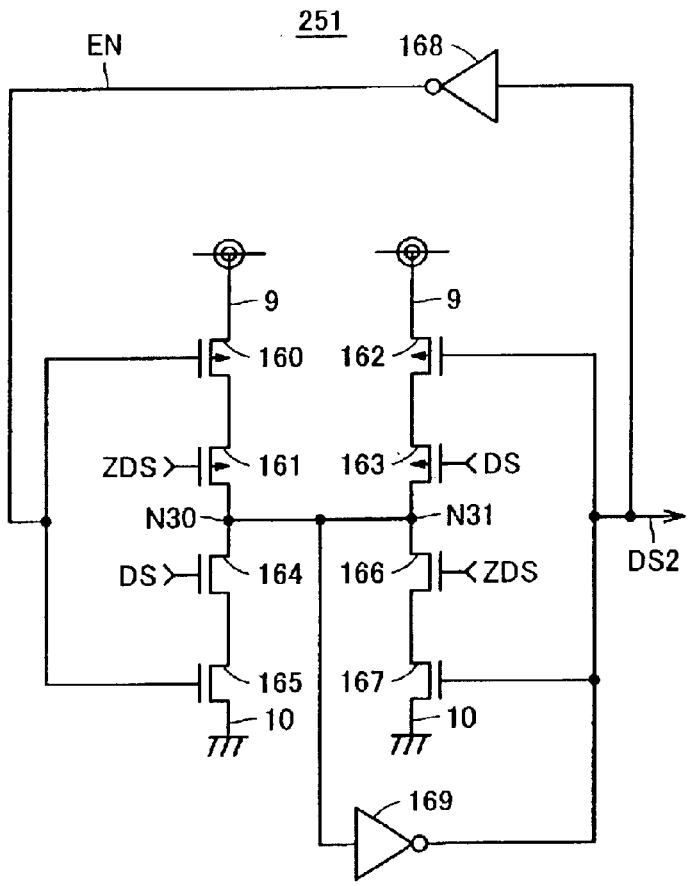
FIG. 24 is a circuit diagram showing the configuration of a DS2 generation circuit shown in FIG. 21.

FIG. 24 is a circuit diagram showing the configuration of the DS2 generation circuit shown in FIG. 21.

Referring to FIG. 24, DS2 generation circuit 251 includes P-channel MOS transistors 160 to 163, N-channel MOS transistors 164 to 167, and inverters 168 and 169.

P-channel MOS transistors 160 and 161 and N-channel MOS transistors 164 and 165 are connected in series between internal power supply potential node 9 and ground potential node 10. Signal EN is inputted into the gates of P-channel MOS transistor 160 and N-channel MOS transistor 165. First data strobe signal ZDS is inputted into the gate of P-channel MOS transistor 161 and first data strobe signal DS is inputted into the gate of N-channel MOS transistor 164. Inverter 169 receives and inverts a signal outputted from a node N30 which is the connection point between P-channel MOS transistor 161 and N-channel MOS transistor 164, and outputs the inverted signal as second data strobe signal DS2.

P-channel MOS transistors 162 and 163 and N-channel MOS transistors 166 and 167 are connected in series between internal power supply potential node 9 and ground potential node 10. Second data strobe signal DS2 is inputted into the gates of P-channel MOS transistor 162 and N-channel MOS transistor 167. First data strobe signal DS is inputted into the gate of P-channel MOS transistor 163 and first data strobe signal ZDS is inputted into the gate of N-channel MOS transistor 166. A node N31 which is the connection point between P-channel MOS transistor 163 and N-channel MOS transistor 166 is connected to node N30.

Inverter 168 receives and inverts second data strobe signal DS2 and outputs the inverted signal as signal EN.

Figure 25:
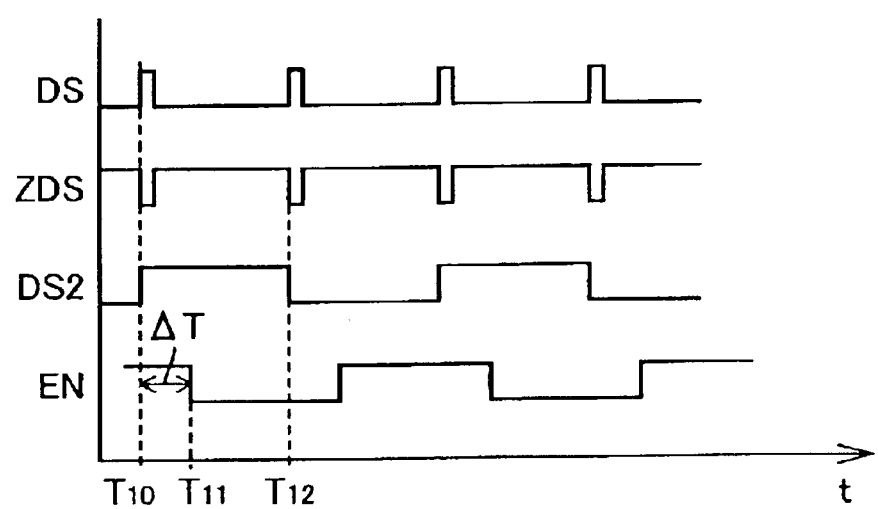
FIG. 25 is a timing chart for showing the operations of the DS generation circuit and the DS2 generation circuit.

FIG. 25 is a timing chart showing the operations of DS generation circuit 250 and DS2 generation circuit 251.

Referring to FIG. 25, at time T10, DS generation circuit 250 activates data strobe signal DS which is a one-shot pulse signal, to H level. At this moment, data strobe signal ZDS is activated to L level.

In DS2 generation circuit 251, therefore, second data strobe signal DS2 is activated to H level. After time T10 until time T12 until which data strobe signal DS is activated again, second data strobe signal DS2 is kept at H level. At time T11 after the passage of ΔT time from time T10, signal EN is activated to L level by the delay effect of inverter 168.

The write operation and read operation of the semiconductor memory device having the above-mentioned circuit configuration will be described. It is assumed that the data buses are in a high impedance state when the write operation and the read operation are not performed in the semiconductor memory device in the seventh embodiment of the present invention.

The write operation of the semiconductor memory device will first be described.

Figure 26:
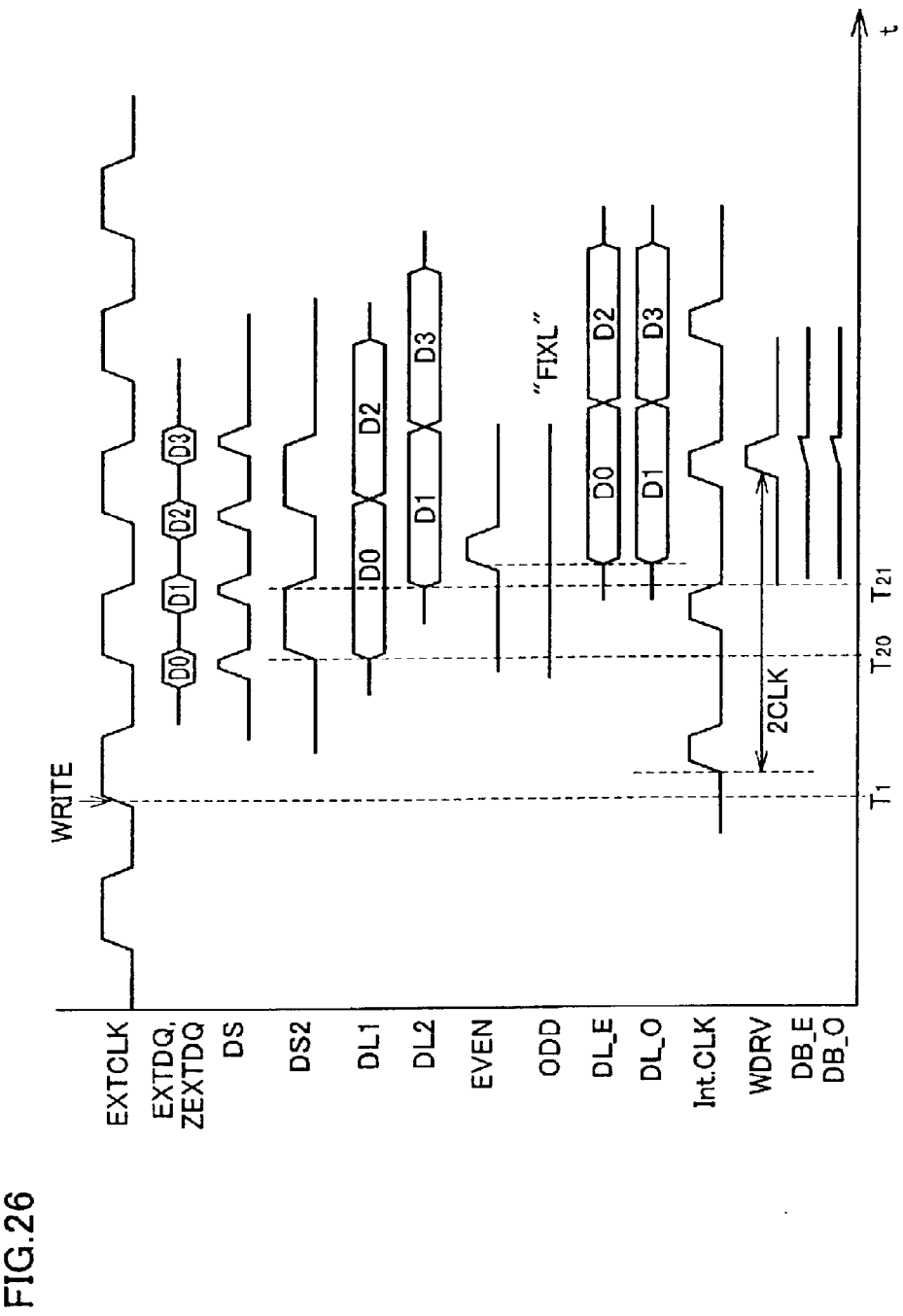
FIG. 26 is a timing chart for showing the write operation of the semiconductor memory device in the seventh embodiment of the present invention.

FIG. 26 is a timing chart showing the write operation of the semiconductor memory device in the seventh embodiment of the present invention.

Referring to FIG. 26, at time T1, write operation signal WRITE is outputted from control circuit 117. After time T1, therefore, complementary external data signals EXTDQ and ZEXTDQ transport data D0 to D4 synchronously with external clock signal EXTCLK.

At time T20 at which data D0 is inputted into input buffer 102, DS generation circuit 250 outputs first data strobe signal DS as a one-shot pulse. At this moment, therefore, second data strobe signal DS2 outputted from DS2 generation circuit 251 rises to H level. Serial/parallel converter 104 latches data D0 in response to the rise of this second data strobe signal DS2 and outputs data D0 to latch circuit 105.

Next, at time T21 at which data D1 is inputted into input buffer 102, DS generation circuit 250 outputs first data strobe signal DS again as a one-shot pulse. At this moment, therefore, second data strobe signal DS2 outputted from DS2 generation circuit 251 falls to L level. Serial/parallel converter 104 latches data D1 in response to the fall of this second data strobe signal DS2 and outputs data D1 to latch circuit 106.

Since the operation after time T21 is the same as the operation after time T21 shown in FIG. 14, it will not be repeatedly described herein.

As can be seen from the above, the semiconductor memory device in the seventh embodiment can write data inputted from the outside of the memory without using external data strobe signal EXTDQS. Therefore, the write operation of the semiconductor memory device can be simplified.

Next, the read operation of the semiconductor memory device in the seventh embodiment will be described.

Firstly, the configuration of output buffer 132 shown in FIG. 21 will be described.

Figure 27:
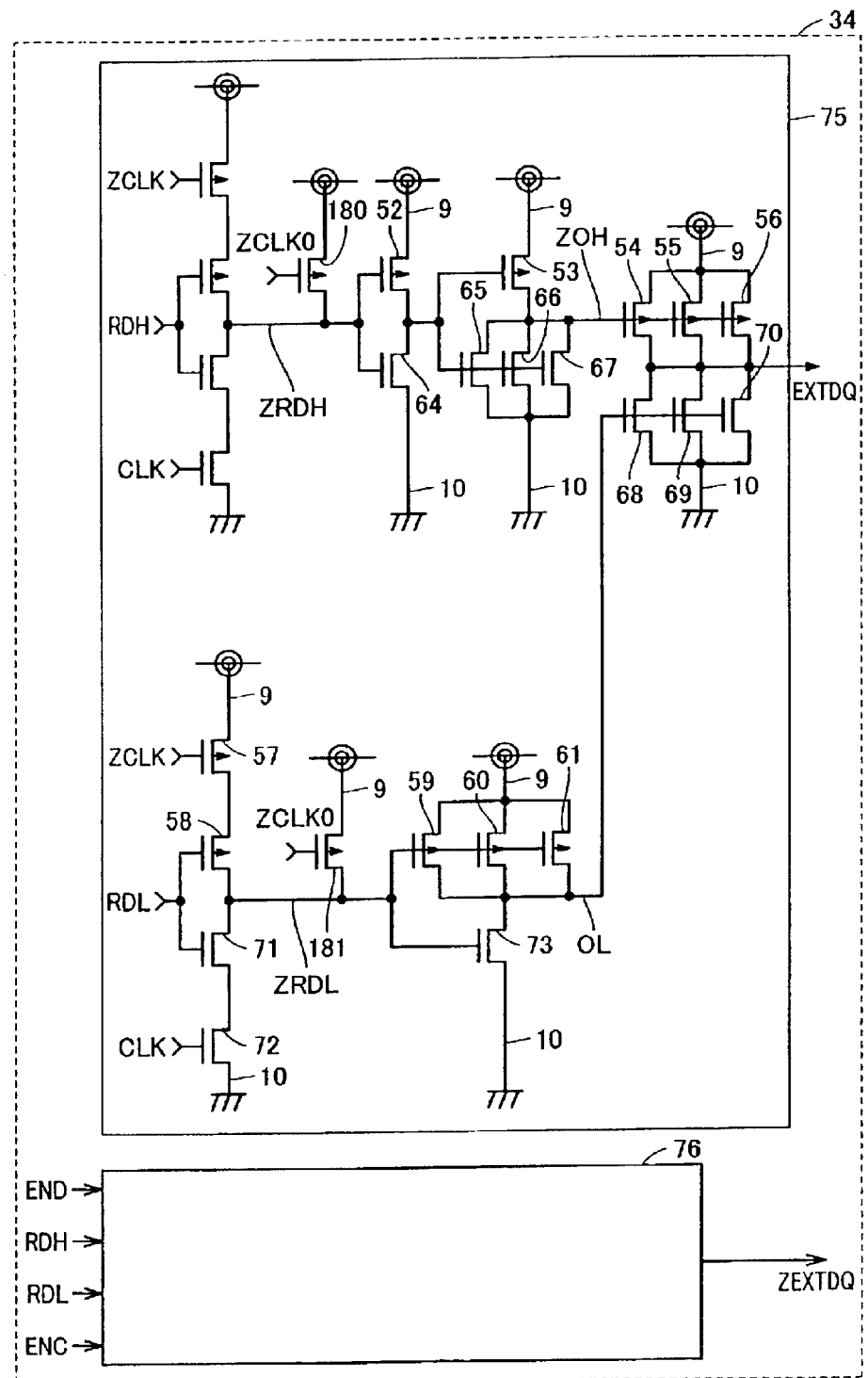
FIG. 27 is a circuit diagram showing the configuration of an output buffer shown in FIG. 21.

FIG. 27 is a circuit diagram showing the configuration of the output buffer shown in FIG. 21.

Referring to FIG. 27, compared with FIG. 5, output buffer 75 newly includes P-channel MOS transistors 180 and 181.

P-channel MOS transistor 180 is connected between internal power supply potential node 9 and the drain of P-channel MOS transistor 51. Internal clock signal ZCLK is inputted into the gate of P-channel MOS transistor 180.

P-channel MOS transistor 181 is connected between internal power supply potential node 9 and the gate of P-channel MOS transistor 59. Internal clock signal ZCLK is inputted into the gate of P-channel MOS transistor 181.

Since the remaining circuit configuration is the same as that shown in FIG. 5, it will not be repeatedly described herein. It is noted that the configuration of second output buffer 76 shown in FIG. 27 is the same as that of first output buffer shown in FIG. 27. However, read data signal RDL is inputted into the gate of P-channel MOS transistor 51 and that of N-channel MOS transistor 62 and read data signal RDH is inputted into the gate of P-channel MOS transistor 58 and that of N-channel MOS transistor 71.

The read operation of the semiconductor memory device including the output buffer constituted as described above will be described.

Figure 28:
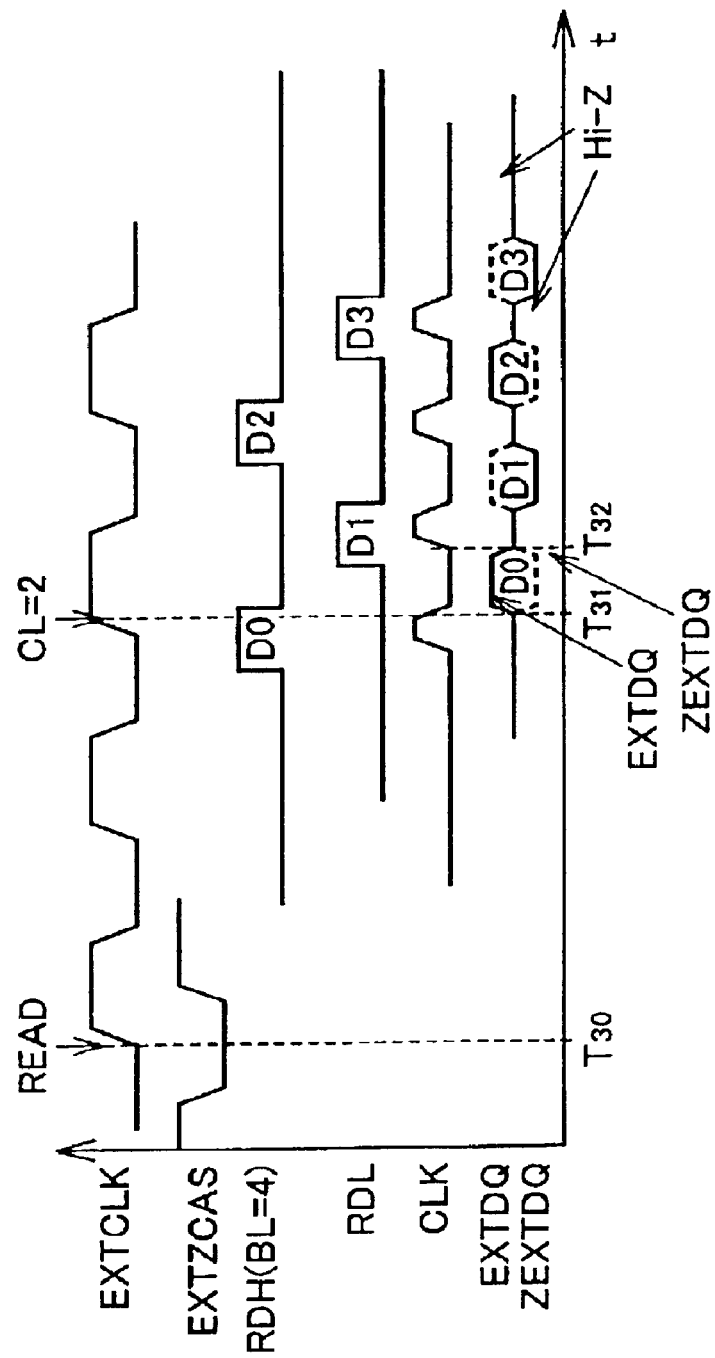
FIG. 28 is a timing chart for showing the read operation of the semiconductor memory device in the seventh embodiment of the present invention.
Figure 29:
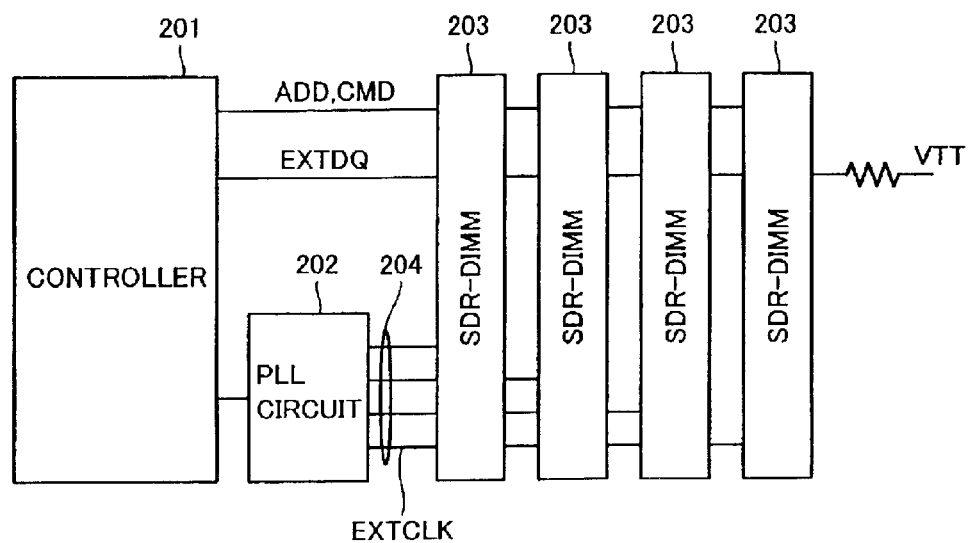
FIG. 29 is a block diagram showing the configuration of a data processing system which employs a plurality of semiconductor memory devices.

FIG. 28 is a timing chart showing the read operation of the semiconductor memory device in the seventh embodiment of the present invention.

Referring to FIG. 28, at time T30, a read operation signal READ is outputted from control circuit 117. Read operation signal READ is a signal outputted from control circuit 117 when the read operation is performed.

Here, if it is assumed that a burst length is 4, read data signal RDH transports data D0 and D2 and read signal RDL transports data D1 and D3.

If it is assumed that the latency of the read operation is 2, at time T31 after the passage of two clocks of external clock signal EXTCLK, data D0 transported by read data signal RDH is outputted from output buffer 132 to external data signals EXTDQ and ZEXTDQ. Here, when the level of internal clock signal CLK becomes H level at time T32, P-channel MOS transistors 180 and 181 in first output buffer 75 and second output buffer 76 in output buffer 132 are turned on. As a result, output buffer 132 stops operating. Due to this, while clock signal CLK is at H level, external data signals EXTDQ and ZEXTDQ are both in a high impedance state.

When the level of internal clock signal CLK becomes L level, output buffer 132 starts operating again and outputs data D1 while internal clock signal CLK is at L level.

As can be seen, in the semiconductor memory device in this embodiment, the data transported by external data signals EXTDQ and ZEXTDQ outputted from the output buffer during the read operation is in a high impedance state. It is, therefore, possible to output data without using the external data strobe signal.

By adopting the above-mentioned configuration, the semiconductor memory device in the seventh embodiment of the present invention does not require the external data strobe signal, making it possible to simplify the write operation and the read operation.

The DS generation circuit and DS2 generation circuit may be included in each semiconductor memory device in the data processing system as shown in the seventh embodiment of the present invention or one DS generation circuit and one DS2 generation circuit may be included in the entire data processing system. In addition, reference potentials VREFH and VREFL inputted into the DS generation circuit may be generated inside the semiconductor memory device or inside the data processing system, or may be inputted from the outside of the system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    an input buffer for receiving a first data signal inputted externally, a second data signal complementary to said first data signal and inputted externally, and a reference signal, and generating an internal data signal; and
    a select circuit for selecting a signal used when said input buffer generates said internal data signal, from said second data signal and said reference signal.

2. The semiconductor memory device according to claim 1, wherein said select circuit selects said used signal according to an address signal.

3. The semiconductor memory device according to claim 2, wherein said input buffer includes:
    a first differential amplifier circuit which receives said first and second data signals to generate said internal data signal; and
    a second differential amplifier circuit which receives said first data signal and said reference signal to generate said internal data signal, and
    said select circuit selects one of said first and second differential amplifier circuits in response to said address signal.

4. The semiconductor memory device according to claim 2, wherein said input buffer includes:
    a first differential input node which receives said first data signal;
    a second differential input node which receives said second data signal; and
    a third differential input node which receives said reference signal, and
    said select circuit selects one of said second and third differential input nodes in response to said address signal, and said input buffer generates said internal data signal from the signal inputted into the selected differential input node and said first data signal inputted into said first differential input node.

5. The semiconductor memory device according to claim 4, wherein said input buffer includes a fuse.

6. The semiconductor memory device according to claim 2, further comprising:
    an output buffer which outputs a third data signal to the outside, and which outputs a fourth data signal complementary to said third data signal in response to an indication from said select circuit.

7. The semiconductor memory device according to claim 2, wherein said select circuit selects said used signal in response to each of a write operation and a read operation.

8. The semiconductor memory device according to claim 1, wherein:
    said select circuit selects said second data signal during the write operation, and
    said semiconductor memory device further comprises:
        a strobe signal generation circuit which receives said first and second data signals, and which generates a strobe signal for fetching said first and second data signals; and
        a serial-to-parallel conversion circuit which receives said strobe signal, and which rearranges the internal data signal outputted from said input buffer to a plurality of parallel data signals to output the parallel data signals.

9. A semiconductor memory device comprising:
    a first input buffer which receives a first data signal inputted from an outside of the memory and a reference signal, and which generates a first internal data signal;
    a second input buffer which receives a second data signal inputted from the outside and complementary to said first data signal, and said reference signal, and which generates a second internal data signal; and
    an internal circuit which receives a strobe signal inputted from the outside for fetching said first and second data signals, and which receives said first and second internal data signals.

* * * * *